US009613980B2

(12) United States Patent
Yamada et al.

(10) Patent No.: US 9,613,980 B2
(45) Date of Patent: Apr. 4, 2017

(54) SEMICONDUCTOR MEMORY DEVICE

(71) Applicant: Kabushiki Kaisha Toshiba, Minato-ku (JP)

(72) Inventors: Kenta Yamada, Yokkaichi (JP); Yasuhiro Uchiyama, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/069,637

(22) Filed: Mar. 14, 2016

(65) Prior Publication Data

US 2017/0069658 A1    Mar. 9, 2017

Related U.S. Application Data

(60) Provisional application No. 62/216,140, filed on Sep. 9, 2015.

(51) Int. Cl.

| G11C 11/34 | (2006.01) |
|---|---|
| H01L 27/11582 | (2017.01) |
| H01L 27/11524 | (2017.01) |
| H01L 27/11556 | (2017.01) |
| H01L 27/1157 | (2017.01) |
| H01L 23/528 | (2006.01) |
| G11C 16/26 | (2006.01) |

(52) U.S. Cl.
CPC ........ *H01L 27/11582* (2013.01); *G11C 16/26* (2013.01); *H01L 23/528* (2013.01); *H01L 27/1157* (2013.01); *H01L 27/11524* (2013.01); *H01L 27/11556* (2013.01)

(58) Field of Classification Search
CPC ............. H01L 27/11582; H01L 23/528; H01L 27/11524; H01L 27/11556; H01L 27/1157; G11C 16/26
USPC ............ 365/185.18, 185.03, 185.05, 185.06, 365/185.11, 185.12, 185.13, 185.17, 365/185.23, 174, 186
See application file for complete search history.

(56) References Cited

U.S. PATENT DOCUMENTS 9,190,151 B2 *  11/2015  Nam .................. G11C 16/0483

* cited by examiner

*Primary Examiner* — Fernando Hidalgo
(74) *Attorney, Agent, or Firm* — Oblon, McClelland, Maier & Neustadt, L.L.P.

(57) ABSTRACT

A semiconductor memory device includes a substrate, a plurality of first control gate electrodes, a plurality of second control gate electrodes, first to second select gate electrodes, first to second gate electrodes, a bit line, first to second semiconductor pillars, and a controller. The controller applies a first potential to the first select gate electrode, a third potential lower than the first potential to the second select gate electrode, a second potential to the first gate electrode and the second gate electrode, a selecting potential not less than the third potential to one of the plurality of the first control gate electrodes, and an unselecting potential higher than the selecting potential to other than the one of the plurality of first control gate electrodes in a reading operation.

17 Claims, 14 Drawing Sheets

SEMICONDUCTOR MEMORY DEVICE

CROSS-REFERENCE TO RELATED APPLICATIONS

This application is based upon and claims the benefit of priority from U.S. Provisional Patent Application 62/216,140 filed on Sep. 9, 2015; the entire contents of which are incorporated herein by reference.

FIELD

Embodiments described herein relate generally to a semiconductor memory device.

BACKGROUND

There is a stacked semiconductor memory device including memory cells that are three-dimensionally disposed for increasing the degree of integration of memory. The semiconductor memory device includes a plurality of semiconductor pillars extending in a stacking direction and a plurality of electrode films (word lines) extending in a direction intersecting the stacking direction and arranged in the stacking direction. A memory cell is formed between the semiconductor pillar and the electrode film. In the semiconductor memory device, it is desired to operate in a stable.

DETAILED DESCRIPTION

Figure 1:
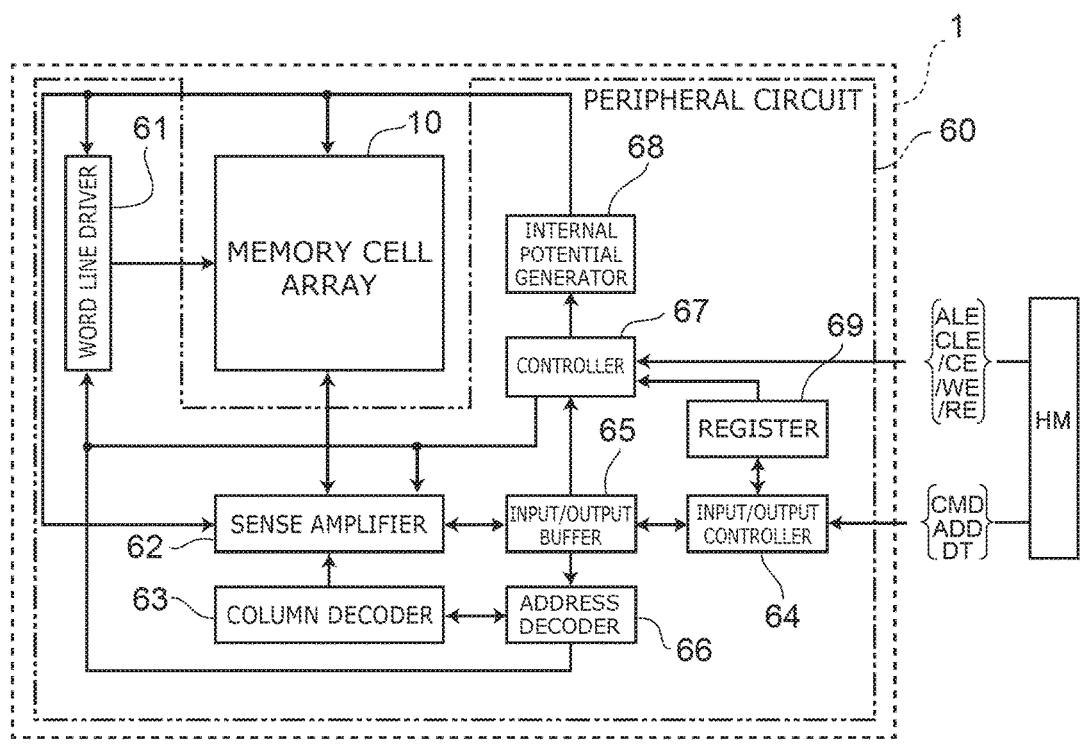
FIG. 1 is a block diagram illustrating a semiconductor memory device according to a first embodiment.

According to one embodiment, a semiconductor memory device includes a substrate, a plurality of first control gate electrodes, a plurality of second control gate electrodes, a first select gate electrode, a second select gate electrode, a first gate electrode, a second gate electrode, a bit line, a first semiconductor pillar, a second semiconductor pillar, and a controller. The plurality of first control gate electrodes is stacked along a first direction above the substrate. The plurality of second control gate electrodes is stacked along the first direction above the substrate. The plurality of second control gate electrodes is arranged with the plurality of first control gate electrodes in a second direction intersecting the first direction. The first select gate electrode is provided above the plurality of first control gate electrodes. The second select gate electrode is provided above the plurality of second control gate electrodes. The first gate electrode is provided above the first select gate electrode. The second gate electrode is provided above the second select gate electrode. The bit line is provided above the first gate electrode and the second gate electrode. The bit line extends in the second direction. The first semiconductor pillar pierces the plurality of first control gate electrodes, the first select gate electrode and the first gate electrode in the first direction and electrically connected to the bit line. The second semiconductor pillar pierces the plurality of second control gate electrodes, the second select gate electrode and the second gate electrode in the first direction and electrically connected to the bit line. The controller is configured to apply a first potential to the first select gate electrode, a third potential lower than the first potential to the second select gate electrode, a second potential to the first and second gate electrodes, a selecting potential not less than the third potential to one of the plurality of first control gate electrodes, and an unselecting potential higher than the selecting potential to other than the one of the plurality of first control gate electrodes in a reading operation.

Hereinafter, embodiments of the invention will be described with reference to the drawings.

The drawings are schematic or conceptual, and the relationships between the thicknesses and widths of portions the proportions of sizes between portions, etc., are not necessarily the same as the actual values thereof. Further, the dimensions and/or the proportions may be illustrated differently between the drawings, even in the case where the same portion is illustrated.

In the drawings and the specification of the application, components similar to those described in regard to a drawing thereinabove are marked with like reference numerals, and a detailed description is omitted as appropriate.

First Embodiment

FIG. 1 is a block diagram illustrating a semiconductor memory device according to the first embodiment.

A semiconductor memory device 1 according to the embodiment includes a memory cell array 10 and a peripheral circuit 60 including the other parts. The memory cell array 10 mainly stores data. The memory cell array 10 is an aggregate of memory cells. Data is written in or read from the respective memory cells of the memory cell array 10 in response to input from the peripheral circuit 60. The peripheral circuit 60 supplies a necessary potential to the memory cell array 10 to allow the semiconductor memory device 1 to operate in response to input from the external.

In the memory cell array 10, e.g. a plurality of memory cells are disposed in a three-dimensional matrix. The memory cell array 10 includes a plurality of bit lines, a plurality of electrode films, and a source layer for controlling the potentials of the memory cells. The electrode films function as word lines.

As shown in FIG. 1, the peripheral circuit 60 includes a word line driver 61, a sense amplifier 62, a column decoder 63, an input/output controller 64, an input/output buffer 65, an address decoder 66, a controller 67, an internal potential generator 68, and a register 69.

The word line driver 61 is connected to the plurality of word lines. The word line driver 61 selects and drives the word lines in reading, writing, and erasing of data based on an output signal of the address decoder 66.

The sense amplifier 62 senses potentials of the bit lines in reading of data. Further, the amplifier applies potentials according to write data to the bit lines in writing of data.

The column decoder 63 generates a column selection signal for selection of the bit lines and sends the column selection signal to the sense amplifier 62 based on the output signal of the address decoder 66.

The input/output controller 64 receives various externally supplied commands CMD, address signals ADD, and write data DT.

Specifically, in writing of data, the write data DT is sent to the sense amplifier 62 via the input/output controller 64 and the input/output buffer 65. Further, in reading of data, read data read by the sense amplifier 62 is sent to the input/output controller 64 via the input/output buffer 65. Then, the data is output from the input/output controller 64 to an external circuit HM (e.g. a memory controller or host).

The address signal ADD sent from the input/output controller 64 to the input/output buffer 65 is sent to the address decoder 66. The address decoder 66 decodes the address signal ADD, sends a row address to the word line driver 61, and sends a column address to the column decoder 63.

The command CMD sent from the input/output controller 64 to the input/output buffer 65 is sent to the controller 67.

To the controller 67, external control signals including a chip enable signal/CE, a write enable signal/WE, a read enable signal/RE, an address latch enable signal ALE, a command latch enable signal CLE, etc. are supplied from the external circuit HM.

The controller 67 generates a control signal for controlling sequences of writing and erasing data and a control signal for controlling reading data based on the external control signal and the command CMD supplied in response to an operation mode. The control signal is sent to the word line driver 61, the sense amplifier 62, and the internal potential generator 68. The controller 67 performs integrated control of various operations of the semiconductor memory device 1 using the control signals.

The controller 67 is not necessarily disposed within the semiconductor memory device 1. That is, the unit may be disposed in another semiconductor memory device than the semiconductor memory device 1 or disposed within the external circuit HM.

The internal potential generator 68 generates potentials necessary for various operations of the memory cell array 10, the word line driver 61, and the sense amplifier 62 including a read potential, a write potential, a verify potential, and an erase potential in response to the various control signals sent from the controller 67.

The register 69 is connected to the input/output controller 64 and the controller 67, and stores various parameters suitable for the quality of the semiconductor memory device 1 determined in the test process.

The controller 67 sends a control signal for instructing output of the potential to be applied to gate electrodes TG (see FIG. 4 and FIG. 5) to the internal potential generator 68. The gate electrodes TG include a first gate electrode TG1 and a second gate electrode TG2.

Figure 2:
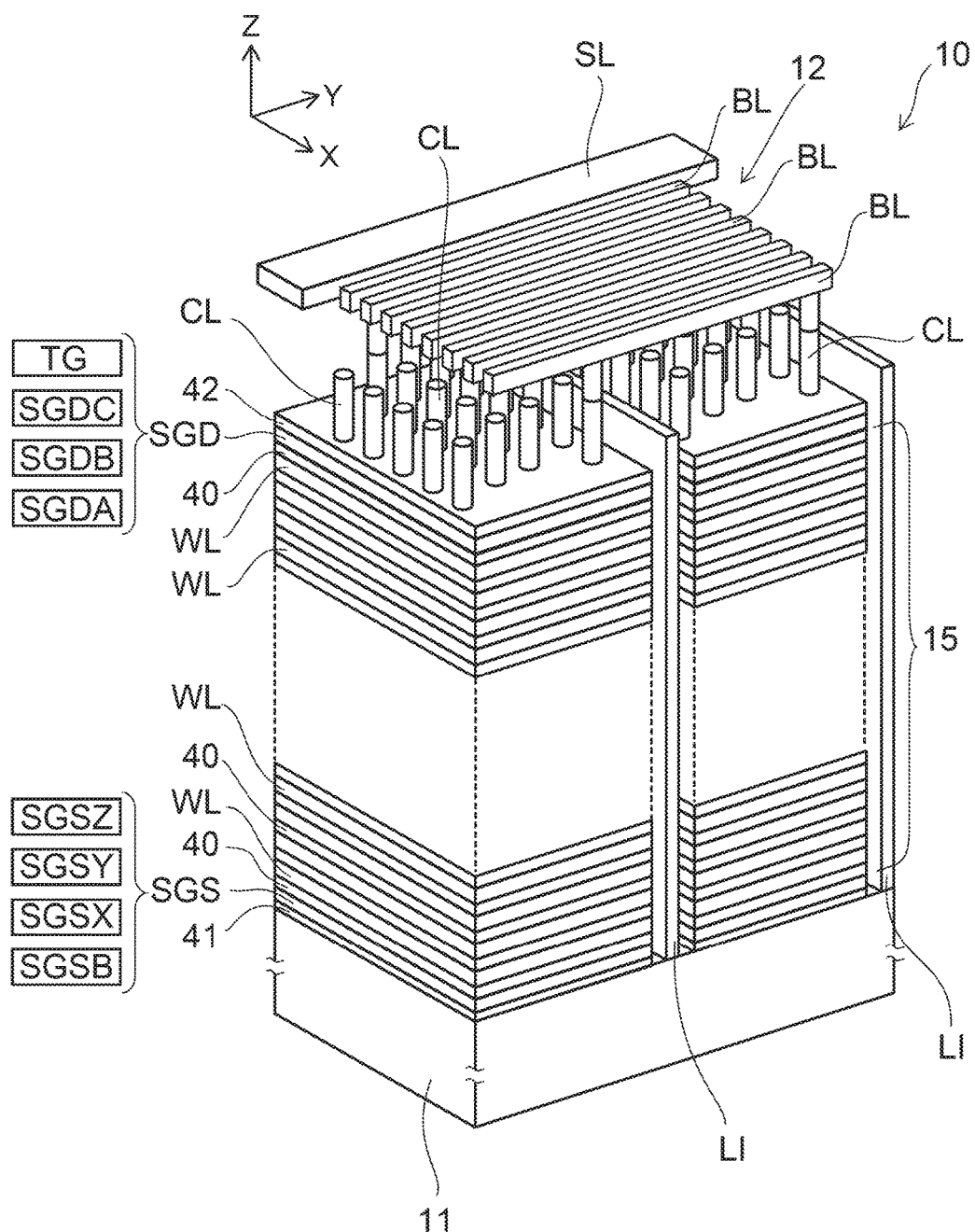
FIG. 2 is a schematic perspective view illustrating the memory cell array according to the first embodiment.

FIG. 2 is a schematic perspective view illustrating the memory cell array according to the first embodiment.

Figure 3:
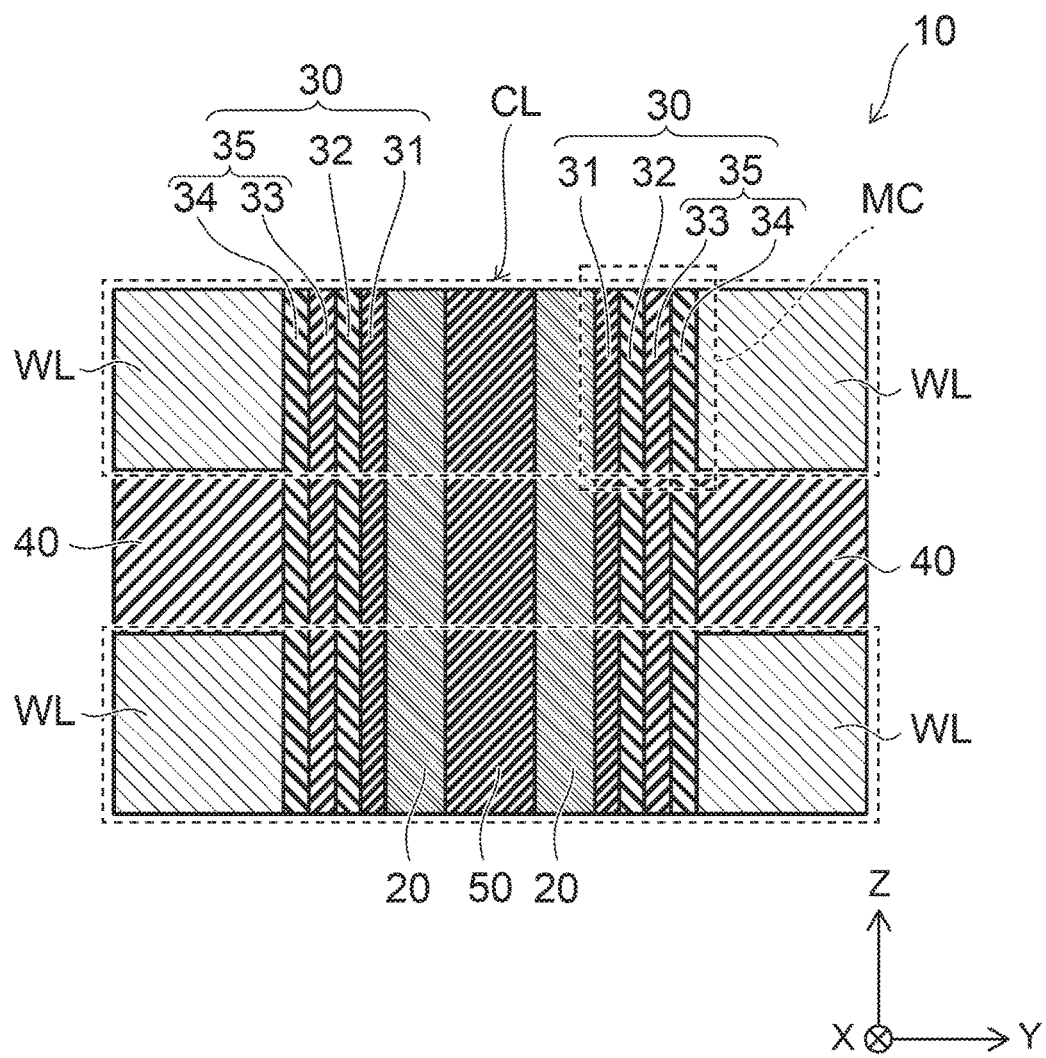
FIG. 3 is a schematic sectional view illustrating a part of the memory cell array according to the first embodiment.

FIG. 3 is a schematic sectional view illustrating a part of the memory cell array according to the first embodiment.

Note that, in FIG. 2, insulating films between the electrode films etc. are not shown for facilitation of visualization.

The memory cell array 10 includes a substrate 11, a stacked body 15, a source-side select gate electrode layer SGS, a drain-side select gate electrode layer SGD, a plurality of memory columnar bodies CL, an interconnect layer 12, an insulating film 41, and an insulating film 42.

In the example, two directions parallel to a major surface of the substrate 11 and perpendicular to each other are an X-direction and a Y-direction. A direction perpendicular to both the X-direction and the Y-direction is a Z-direction (stacking direction). A first direction is e.g. the Z-direction. A second direction is e.g. the Y-direction. A third direction is e.g. the X-direction.

The interconnect layer 12 includes the plurality of bit lines BL and the source layer SL. The interconnect layer 12 is separately provided from the substrate 11 in the Z-direction. The plurality of bit lines BL extend in the Y-direction and are arranged in the X-direction.

The stacked body 15 is disposed between the substrate 11 and the interconnect layer 12. The insulating film 41 is provided on the substrate 11. The insulating film 42 is provided under the interconnect layer 12. The source-side select gate electrode layer SGS is disposed between the stacked body 15 and the insulating film 41. The source-side select gate electrode layer SGS includes e.g. four select gate electrodes SGSB, SGSX to SGSZ. The drain-side select gate electrode layer SGD is disposed between the stacked body 15 and the insulating film 42. The drain-side select gate electrode layer SGD includes the gate electrode TG and three select gate electrodes SGDA to SGDC.

The stacked body 15 includes the plurality of electrode films WL and a plurality of insulating films 40. In the stacked body 15, the insulating film 40 is provided between two electrode films WL. Namely, the plurality of electrode films WL and the plurality of insulating films 40 are respectively and alternately stacked. Note that the number of stacked electrode films WL shown in FIG. 2 is just an example, and the number of stacked electrode films WL may be arbitrary. The electrode films WL function as word lines.

For a material of the electrode film WL, e.g. a metal is used. The electrode film WL contains at least one of e.g. tungsten, molybdenum, titanium nitride, and tungsten nitride. The electrode film WL may contain silicon or metal silicide. For instance, the same material as that of the electrode film WL is used for the source-side select gate electrode layer SGS and the drain-side select gate electrode layer SGD. For a material of the plurality of insulating films 40, the insulating film 41, and the insulating film 42, e.g. silicon oxide is used.

The plurality of memory columnar bodies CL extending in the Z-direction are disposed within the stacked body 15. The memory columnar bodies CL have e.g. circular cylinder shapes or elliptic cylinder shapes. The plurality of memory columnar bodies CL are disposed in e.g. a staggered arrangement. The plurality of memory columnar bodies CL may be disposed in a square grid pattern along the X-direction and the Y-direction. The memory columnar bodies CL are electrically connected to the substrate 11.

In the stacked body 15, inter-layer interconnect layers LI extending in the X-direction and the Z-direction within the stacked body 15 are disposed. The lower ends of the inter-layer interconnect layers LI are disposed within the substrate 11. The inter-layer interconnect layers LI are electrically connected to respective semiconductor pillars 20 within the memory columnar bodies CL via the substrate 11. The upper ends of the inter-layer interconnect layers LI are electrically connected to the peripheral circuit 60 via contact portions (not shown).

The plurality of bit lines BL are disposed on the stacked body 15. The plurality of bit lines BL are arranged respectively separately in the X-direction and extend in the Y-direction. The respective plurality of bit lines BL are electrically connected to the upper ends of the respective plurality of semiconductor pillars 20.

In the plurality of memory columnar bodies CL, the plurality of semiconductor pillars 20 selected one by one from the respective regions separated in the Y-direction via the inter-layer interconnect layers LI are connected to one common bit line BL.

As shown in FIG. 3, the memory columnar body CL includes the semiconductor pillar 20, a memory film 30, and a core insulating material 50. The memory film 30 is disposed between the electrode film WL and the semiconductor pillar 20 and between the insulating film 40 and the semiconductor pillar 20. The memory film 30 is provided along the outer side surface of the semiconductor pillar 20. The memory film 30 and the semiconductor pillar 20 extend in the Z-direction.

The core insulating material 50 is provided on the inner side surface of the semiconductor pillar 20. The semiconductor pillar 20 has e.g. a columnar shape. For the semiconductor pillar 20, e.g. a silicon film containing silicon as a major component is used. For the core insulating material 50, e.g. a silicon oxide film is used. The core insulating material 50 may include an air gap.

The memory cell MC is of e.g. a charge trap type, and formed between the electrode film WL and the semiconductor pillar 20. The semiconductor pillar 20 functions as a channel in the memory cell MC. The electrode film WL functions as a control gate of the memory cell MC. That is, at a crossing portion between each semiconductor pillar 20 and each electrode film WL, the memory cell MC including a structure in which the control gate surrounds the channel is formed.

The memory cell MC includes the memory film 30. The memory film 30 includes a tunnel insulating film 31, a charge storage film 32, and a block insulating film 35. The charge storage film 32 is disposed between the block insulating film 35 and the tunnel insulating film 31. For the memory film 30, a floating gate may be used in place of the charge storage film 32. For instance, a structure in which the plurality of electrode films WL are dug and a floating gate is embedded therein may be employed.

The tunnel insulating film 31 is disposed in contact with the semiconductor pillar 20. The tunnel insulating film 31 serves as a potential barrier when charge is injected from the semiconductor pillar 20 into the charge storage film 32 or when charge stored in the charge storage film 32 is diffused into the semiconductor pillar 20. For the tunnel insulating film 31, e.g. a silicon oxide film is used. As the tunnel insulating film 31, a stacked film (ONO film) having a structure in which a pair of silicon oxide films interpose a silicon nitride film may be used. The ONO film is used as the tunnel insulating film 31, and thereby, erasing operation may be performed with the lower electric field than that for a single layer of silicon oxide film.

The charge storage film 32 functions as a data memory layer and stores charge injected from the semiconductor pillar 20. The charge storage film 32 has many trap sites for trapping charge. For the charge storage film 32, e.g. at least one of a silicon nitride film and hafnium oxide is used.

The block insulating film 35 in contact with the electrode film WL suppresses diffusion of the charge stored in the charge storage film 32 into the electrode film WL. The block insulating film 35 includes e.g. a cap film 34 and a block film 33. The block film 33 is disposed between the cap film 34 and the charge storage film 32. For the block film 33, e.g. a silicon oxide film is used. The cap film 34 is disposed in contact with the electrode film WL. For the cap film 34, a film having the higher dielectric constant than the block film 33 is used. The cap film 34 is disposed in contact with the electrode film WL, and thereby, it is possible to suppress back tunneling electrons injected from the electrode film WL in erasing and improve the charge blocking property.

It is possible that the semiconductor memory device 1 of the embodiment electrically freely performs erasing and writing of data and retains memory contents even when power is turned off.

Figure 4:
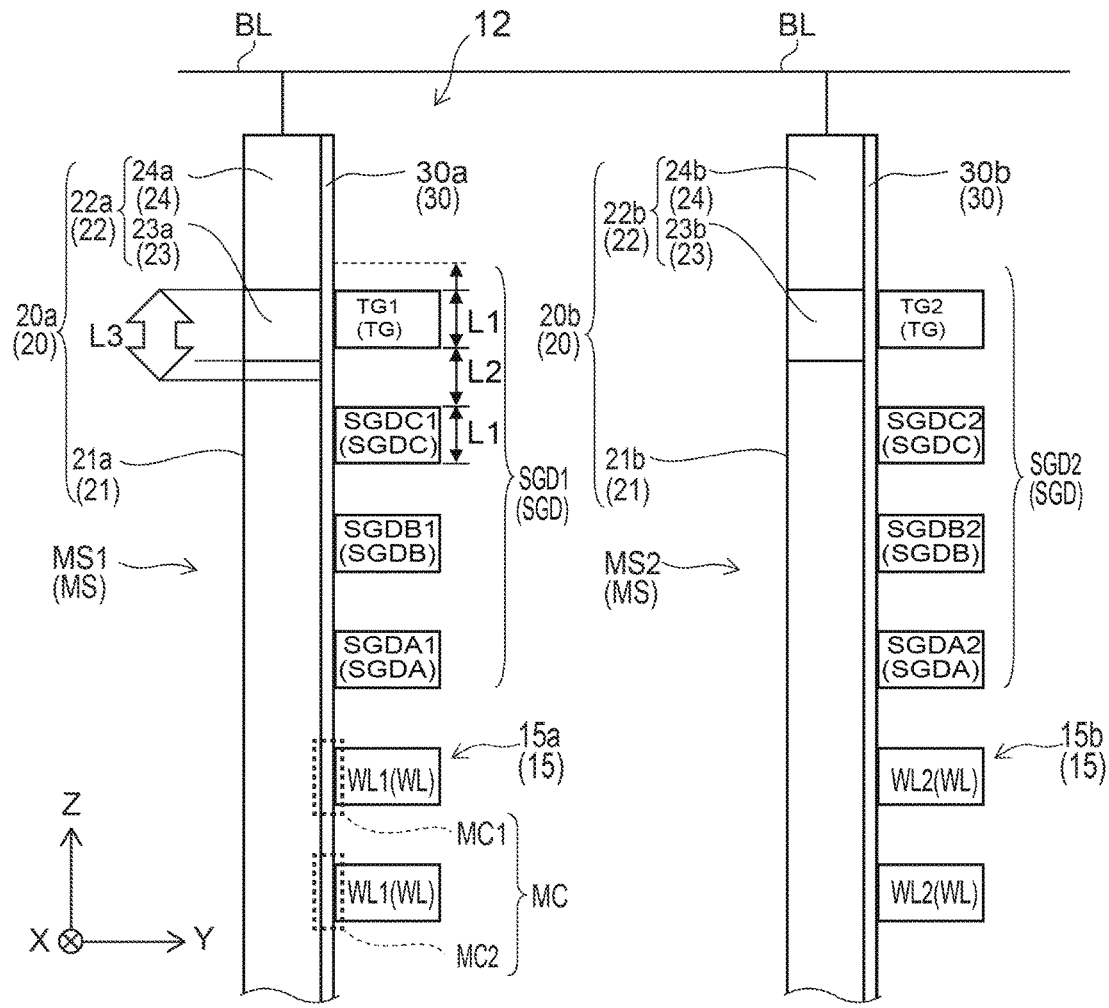
FIG. 4 is a schematic sectional view illustrating a memory string of the semiconductor memory device according to the first embodiment.

FIG. 4 is a schematic sectional view illustrating a memory string of the semiconductor memory device 1 according to the first embodiment.

As shown in FIG. 4, a first memory string MS1 includes a first semiconductor pillar 20a, a first memory film 30a, a first stacked body 15a, and a first drain-side select gate electrode layer SGD1. A second memory string MS2 includes a second semiconductor pillar 20b, a second memory film 30b, a second stacked body 15b, and a second drain-side select gate electrode layer SGD2. The first memory string MS1 is one of a plurality of memory strings MS. The second memory string MS2 is another one of the plurality of memory strings MS. The second memory string MS2 is arranged with the first memory string MS1 in the Y direction. Here, the source-side select gate electrode layer SGS is not shown.

The first memory film 30a is provided along the outer side surface of the first semiconductor pillar 20a. The first stacked body 15a includes a plurality of first electrode films WL1 (a plurality of first control gate electrodes). The plurality of first electrode films WL1 are provided separately from each other in the Z-direction around the first memory film 30a. The second memory film 30b is provided along the outer side surface of the second semiconductor pillar 20b. The second stacked body 15b includes a plurality of second electrode films WL2 (a plurality of second control gate electrodes). The plurality of second electrode films WL2 are provided separately from each other in the Z-direction around the second memory film 30b. Here, the insulating film 40 is not shown.

The first drain-side select gate electrode layer SGD1 includes the first gate electrode TG1 and the three first select gate electrodes SGDA1 to SGDC1. The same potential is applied to the three first select gate electrodes SGDA1 to SGDC1. A potential is applied to the first gate electrode TG1 independently of the three first select gate electrodes SGDA1 to SGDC1. The number of first select gate electrodes SGDA1 to SGDC1 may be arbitrary and only one first select gate electrode may be used.

The second drain-side select gate electrode layer SGD2 includes the second gate electrode TG2 and the three second select gate electrodes SGDA2 to SGDC2. The same potential is applied to the three second select gate electrodes SGDA2 to SGDC2. A potential is applied to the second gate electrode TG2 independently of the three second select gate electrodes SGDA2 to SGDC2. The number of second select gate electrodes SGDA2 to SGDC2 may be arbitrary and only one second select gate electrode may be used.

The first select gate electrodes SGDA1 to SGDC1 are provided around the first memory film 30a between the first stacked body 15a and the interconnect layer 12. The second select gate electrodes SGDA2 to SGDC2 are provided around the second memory film 30b between the second stacked body 15b and the interconnect layer 12. The first select gate electrodes SGDA1 to SGDC1 and the second select gate electrodes SGDA2 to SGDC2 function as gate electrodes of a select gate transistor GTD on the drain side. In the semiconductor memory device 1, a replacing method is used for formation of the gate electrodes. Accordingly, it is difficult to freely change the L-length (the length along the Z-direction) of the gate electrodes. On this account, for instance, a plurality of gate electrodes having the same L-length as the memory cell are bundled and designed as a multi-select gate electrode to satisfy a desired property.

Figure 6:
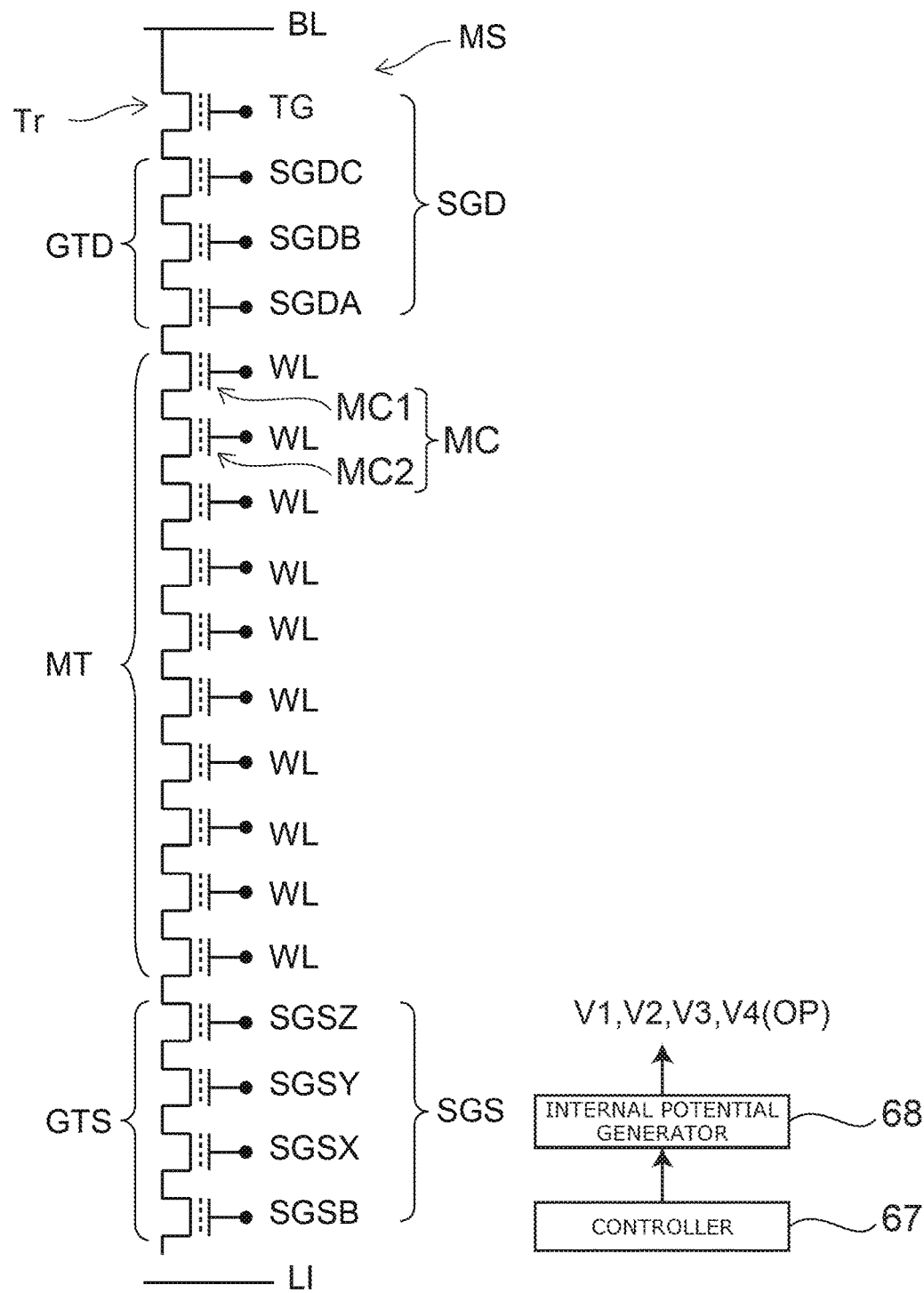
FIG. 6 is a schematic circuit diagram illustrating an equivalent circuit of the memory string shown in FIG. 4.

The first gate electrode TG1 is provided around the first memory film 30a between the first select gate electrodes SGDA1 to SGDC1 and the interconnect layer 12. The first gate electrode TG1 is disposed closer to the side of the bit line BL than the first select gate electrodes SGDA1 to SGDC1. The second gate electrode TG2 is provided around the second memory film 30b between the second select gate electrodes SGDA2 to SGDC2 and the interconnect layer 12. The second gate electrode TG2 is disposed closer to the side of the bit line BL than the second select gate electrodes SGDA2 to SGDC2. Each of the first gate electrode TG1 and the second gate electrode TG2 functions as a gate electrode of a transistor Tr (FIG. 6).

The first semiconductor pillar 20a pierces the first gate electrode TG1, the first select gate electrodes SGDA1 to SGDC1, and the first stacked body 15a in the Z-direction. The first semiconductor pillar 20a is electrically connected to the bit line BL. The first semiconductor pillar 20a includes a first semiconductor layer 21a and a first diffusion layer 22a. The first diffusion layer 22a is provided between the first semiconductor layer 21a and the interconnect layer 12. The first semiconductor layer 21a corresponds to a first portion of a first conductive type. The first diffusion layer 22a corresponds to a second portion of a second conductive type. The first conductive type is of e.g. a p-type. The second conductive type is of e.g. an n-type. The second semiconductor pillar 20b pierces the second gate electrode TG2, the second select gate electrodes SGDA2 to SGDC2, and the second stacked body 15b in the Z-direction. The second semiconductor pillar 20b is electrically connected to the bit line BL. The second semiconductor pillar 20b includes a second semiconductor layer 21b and a second diffusion layer 22b. The second diffusion layer 22b is provided between the second semiconductor layer 21b and the interconnect layer 12.

The first semiconductor layer 21a is of e.g. a p-type. The first diffusion layer 22a is of e.g. an n-type. The second semiconductor layer 21b is of e.g. a p-type. The second diffusion layer 22b is of e.g. an n-type. Each of the first diffusion layer 22a and the second diffusion layer 22b contains e.g. a quinquevalent element (phosphorus, arsenic, or the like) as an impurity.

The carrier concentration of the first semiconductor layer 21a is different from the carrier concentration of the first diffusion layer 22a. The carrier concentration of the first diffusion layer 22a is higher than the carrier concentration of the first semiconductor layer 21a, for example. The first diffusion layer 22a includes a first n$^-$ diffusion layer 23a and a first n$^+$ diffusion layer 24a. The carrier concentration of the first n$^-$ diffusion layer 23a is lower than the carrier concentration of the first n$^+$ diffusion layer 24a. The carrier concentration of the first n$^+$ diffusion layer 24a is not less than e.g. $1\times10^{20}$ atm/cm$^2$. The carrier concentration of the first n$^-$ diffusion layer 23a is less than e.g. $1\times10^{20}$ atm/cm$^2$. The first n$^+$ diffusion layer 24a is provided between the interconnect layer 12 and the first n$^-$ diffusion layer 23a.

The carrier concentration of the second semiconductor layer 21b is different from the carrier concentration of the second diffusion layer 22b. The second diffusion layer 22b includes a second n$^-$ diffusion layer 23b and a second n$^+$ diffusion layer 24b. The carrier concentration of the second n$^-$ diffusion layer 23b is lower than the carrier concentration of the second n$^+$ diffusion layer 24b. The carrier concentration of the second n$^+$ diffusion layer 24b is not less than e.g. $1\times10^{20}$ atm/cm$^2$. The carrier concentration of the second n$^-$ diffusion layer 23b is less than e.g. $1\times10^{20}$ atm/cm$^2$. The second n$^+$ diffusion layer 24b is provided between the interconnect layer 12 and the second n$^-$ diffusion layer 23b.

The memory cells MC (here, the memory cell MC1, the memory cell MC2) are formed between the respective plurality of electrode films WL and the semiconductor pillar 20. These plurality of memory cells MC, the part of the drain-side select gate electrode layer SGD, and the part of the source-side select gate electrode layer SGS are series-connected through the semiconductor pillar 20 and form one memory string MS.

When projected on a flat surface along the Z-direction, at least a part of the n$^-$ diffusion layer 23 overlaps the gate electrode TG. That is, as viewed from the Y-direction and the X-direction, at least the part of the n$^-$ diffusion layer 23 overlaps the gate electrode TG. The upper end of the n$^-$ diffusion layer 23 may be located between the upper end and the lower end of the gate electrode TG. The lower end of the n$^-$ diffusion layer 23 may be located between the upper end and the lower end of the gate electrode TG. The n$^-$ diffusion layer 23 includes a region having the local minimal value of the carrier concentration. As viewed from the Y-direction and the X-direction, the region may overlap the gate electrode TG.

The select gate electrodes SGDA to SGDC do not overlap the n$^-$ diffusion layer 23 when projected on the flat surface along the Z-direction.

The n$^-$ diffusion layer 23 is located above the select gate electrodes SGDA to SGDC in the Z-direction.

The boundary between the semiconductor layer 21 and the n$^-$ diffusion layer 23 is located above the select gate electrodes SGDA to SGDC in the Z-direction and located below the upper surface of the gate electrode TG.

Suppose that respective lengths L1 of the gate electrode TG and the select gate electrode SGDC are 35 nanometers (nm), a gate gap L2 is 45 nm, and the maximum length L3 containing a fluctuation of the n$^-$ diffusion layer 23 is 50 nm. For instance, the upper end of the n$^-$ diffusion layer 23 is disposed in a position (a position of a dotted line) at 22.5 nm above the upper end of the gate electrode TG. The lower end of the n$^-$ diffusion layer 23 is disposed in a position of the upper end of the select gate electrode SGDC. It is desirable that the overlap length between the gate electrode TG and the n⁻ diffusion layer 23 is set to e.g. about ±25 nm.

The reason for overlapping the n⁻ diffusion layer 23 and the gate electrode TG as described above will be described as below.

The memory cell part is required for characteristics with less fluctuations. Accordingly, it is desirable not only to suppress fluctuations in processed shapes but also to consider injection and diffusion of impurities. In the three-dimensional structure like the embodiment, the n⁺ diffusion layer and the n⁻ diffusion layer are formed on the side of the bit line of the memory string. The n⁺ diffusion layer and the n⁻ diffusion layer are formed by thermal diffusion from doped polysilicon or an ion implantation method using phosphorus (P) and arsenic (As). Accordingly, the diffusion layers are significantly affected by fluctuations in buried shape of the doped polysilicon and fluctuations in shape in the ion implantation method. It is difficult to reduce the fluctuations in shape of the n⁻ diffusion layer to below a certain level.

Figure 5:
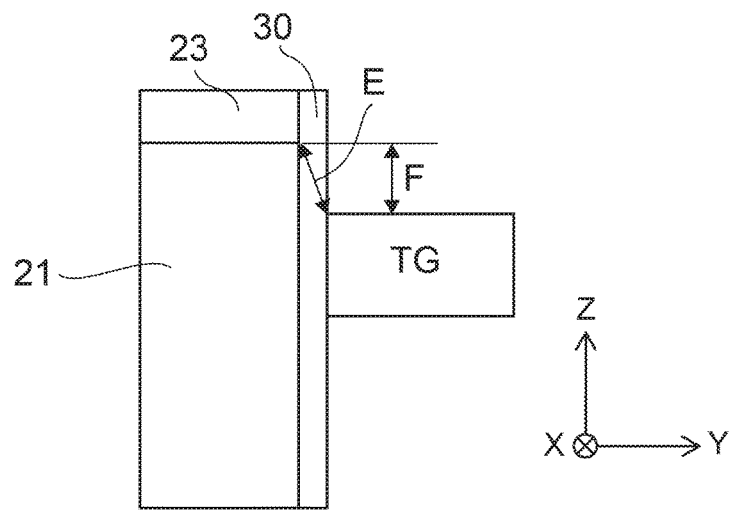
FIG. 5 is a schematic sectional view illustrating a part of the memory string.

FIG. 5 is a schematic sectional view illustrating a part of the memory string.

FIG. 5 shows the case where the n⁻ diffusion layer 23 and the gate electrode TG shown in FIG. 4 are separately disposed. Here, only the n⁻ diffusion layer 23 is shown, but the n⁺ diffusion layer 24 is not shown.

As shown in FIG. 5, due to the fluctuations in shape of the n⁻ diffusion layer 23, the gate electrode TG and the n⁻ diffusion layer 23 may be separated and an offset region F may be formed. The position of the offset region F in the Z-direction is located between the position of the gate electrode TG in the Z-direction and the position of the n⁻ diffusion layer 23 in the Z-direction. It is necessary to invert the offset region F with a fringe electric field. However, the electric field E of the offset region F is lower as the distance between the gate electrode TG and the n⁻ diffusion layer is larger (the distance of the offset region F along the Z-direction is larger). By the reduction of the electric field E, the cell current may be reduced. Accordingly, the gate electrode TG is overlapped on the n⁻ diffusion layer 23 and the reduction of the cell current due to the fluctuations in shape of the n⁻ diffusion layer 23 is suppressed. Thereby, it is possible to reduce the influence on the memory cell characteristics.

FIG. 6 is a schematic circuit diagram illustrating an equivalent circuit of the memory string shown in FIG. 4.

As shown in FIG. 6, the memory string MS includes the transistor Tr including the gate electrode TG, three drain-side select gate transistors GTD each including the select gate electrodes SGDA to SGDC on the drain side, a plurality of memory transistors MT including the respective plurality of electrode films WL, and four source-side select gate transistors GTS including the respective select gate electrode SGSB, SGSX to SGSZ on the source side. As below, the case where the transistor Tr, the drain-side select gate transistors GTD, the memory transistors MT, and the source-side select gate transistors GTS are of the n-type will be described.

In FIG. 4 and FIG. 6, the controller 67 applies a first potential V1 to the first select gate electrodes SGDA1 to SGDC1 and applies a second potential V2 to the first gate electrode TG1 in a reading operation OP of the semiconductor memory device 1. The controller 67 applies a third potential V3 to the second select gate electrodes SGDA2 to SGDC2 and applies the second potential V2 to the second gate electrode TG2.

For instance, these potential applications are performed when the first memory string MS1 is selected and the second memory string MS2 is unselected in the reading operation OP.

Hereinafter, the memory string MS, the memory cell MC, and the word line (electrode film) WL in the selected state are referred to as "selected memory string", "selected memory cell", and "selected word line", respectively. Similarly, the memory string MS, the memory cell MC, and the word line (electrode film) WL in the unselected state are referred to as "unselected memory string", "unselected memory cell", and "unselected word line", respectively.

Note that the same potential as that to the select gate electrodes SGDA to SGDC on the drain side is applied to the source-side select gate electrode layer SGS (here, four select gate electrodes SGSB, SGSX to SGSZ).

Figure 7:
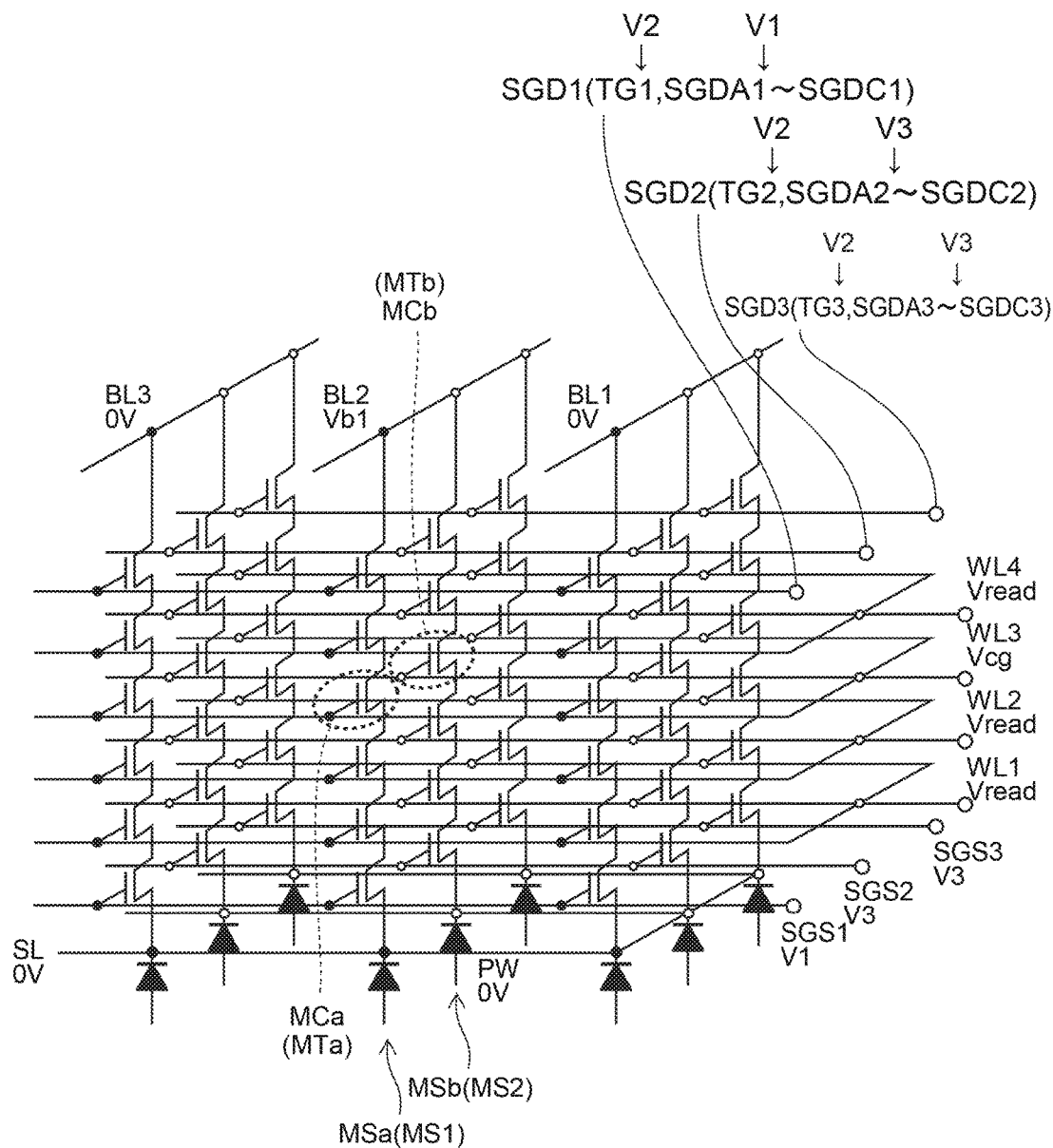
FIG. 7 is a schematic view illustrating a representative biased state when a reading operation of data stored in the memory cell MC is performed.

FIG. 7 is a schematic view illustrating a representative biased state when a reading operation of data stored in the memory cell MC is performed.

The memory transistor MT of the memory cell MC according to the embodiment has a structure of e.g. a vertical transistor. The explanation will be made assuming that a threshold value Vth (neutral threshold value) of the memory cell MC without electrons stored in the charge storage film is around 0 V.

The selected memory string MSa is described. The selected memory string MSa corresponds to the first memory string MS1 in FIG. 4.

The first drain-side select gate electrode layer SGD1 includes the first gate electrode TG1 and the first select gate electrodes SGDA1 to SGDC1. The second drain-side select gate electrode layer SGD2 includes the second gate electrode TG2 and the second select gate electrodes SGDA2 to SGDC2. The third drain-side select gate electrode layer SGD3 includes the third gate electrode TG3 and the third select gate electrodes SGDA3 to SGDC3.

Data is read from the selected memory transistor MTa of the selected memory cell MCa. Note that the other memory cells than the selected memory cell MCa are unselected memory cells MCb. The other memory transistors than the selected memory transistor MTa are unselected memory transistors MTb. The other memory strings than the selected memory string MSa are unselected memory strings MSb. The unselected memory strings MSb correspond to the second memory strings MS2 in FIG. 4.

Vb1 (e.g. 0.5 V) is applied to the bit line BL2 to which the selected memory transistor MTa is connected, 0 V is applied to the other bit lines BL1, BL3, and 0 V is applied to the source layer SL.

In the selected memory string MSa, the first potential V1 (e.g. 4.3 V) is applied to the first select gate electrodes SGDA1 to SGDC1 of the first drain-side select gate electrode layer SGD1. The first potential V1 is applied to the source-side select gate electrode layer SGS1.

Selecting potential Vcg (e.g. 0 V) is applied to the electrode film WL3, i.e., the selected word line WL to which the selected memory transistor MTa of the selected memory cell MCa is connected.

Unselecting potential Vread (e.g. 7.0 V) is applied to the electrode films WL1, WL2, WL4 connected to the unselected memory transistor MTb of the unselected memory cell MCb, i.e., the unselected word line WL.

A potential difference is generated between the bit line BL2 connected to the selected memory string MSa and the source layer SL. Further, the gate transistors connected to the first select gate electrodes SGDA1 to SGDC1 of the first drain-side select gate electrode layer SGD1 are turned on.

Accordingly, whether or not a current flows from the bit line BL2 to the source layer SL is determined depending on whether the threshold value Vth of the selected memory transistor MTa desired to be read is larger or smaller than the selecting potential Vcg. That is, it is possible to read data of the selected memory transistor MTa by sensing the current or the voltage of the bit line BL2.

Next, the unselected memory string MSb is described.

In the unselected memory string MSb, a third potential V3 (e.g. 0 V) is applied to the second select gate electrodes SGDA2 to SGDC2 of the second drain-side select gate electrode layers SGD2. The third potential V3 is applied to the third select gate electrodes SGDA3 to SGDC3 of the third drain-side select gate electrode layers SGD3. The third potential V3 is applied to the source-side select gate electrode layers SGS2, SGS3. That is, the second select gate electrodes SGDA2 to SGDC2 and the third select gate electrodes SGDA3 to SGDC3 are cut off, and data is not read from the unselected memory string MSb.

The controller 67 applies the first potential V1 to the first select gate electrodes SGDA1 to SGDC1 and puts the memory string MS including the memory cells MC into the selected state. The controller 67 applies the third potential V3 to the second select gate electrodes SGDA2 to SGDC2 and applies the third potential V3 to the third select gate electrodes SGDA3 to SGDC3 and puts the memory strings MS into the unselected state. The third potential V3 is lower than the first potential V1. As a specific example, the first potential V1 is a positive potential e.g. 4.3 V. The third potential V3 is a negative potential e.g. −3.0 V. The third potential V3 may be 0 V. The third potential V3 is e.g. a cutoff potential.

The controller 67 applies the second potential V2 to the first gate electrode TG1 of the first drain-side select gate electrode layer SGD1, and applies the second potential V2 to each of the second gate electrode TG2 of the second drain-side select gate electrode layer SGD2 and the third gate electrode TG3 of the third drain-side select gate electrode layer SGD3. That is, regardless of whether the memory string MS is selected or unselected, the second potential V2 is applied to the first to third gate electrodes TG1 to TG3. The second potential V2 is desirably not less than 1.0 V, and more desirably not less than 2.0 V and not more than 5.0 V. In this manner, a positive potential at a certain level is applied, and thereby, the flow of the current may be improved and a resistance of the current path is avoided. Further, within the range, the existing potential may be used and expansion of the peripheral circuit may be unnecessary. That is, the second potential V2 is set to be not more than the first potential V1, and thereby, a dedicated circuit for boosting may be unnecessary.

For the second potential V2, for instance, a power source potential (e.g. 3.3 V) or 2.4 V of VDDSA (a drive power source for sense amplifier, one of stationary power sources that can stably supply power) may be used. For instance, the second potential V2 may be higher than the third potential V3 and not more than the first potential V1. The second potential V2 may be higher than the third potential V3 and not more than the power source potential.

Here, in the reading operation, one memory string is selected from several thousands of blocks continuing to one bit line BL. Accordingly, severe cutoff characteristics are required for the select gate transistor GTD on the drain side.

The gate electrode TG overlaps the n⁻ diffusion layer 23 when projected on the flat surface along the Z-direction. Accordingly, the property of the transistor Tr is normally on. That is, in reading, if the same cutoff potential with that to the select gate electrodes SGDA to SGDC on the drain side is applied to the gate electrode TG, it is impossible to turn off the transistor Tr. For instance, this is because a leak current due to GIDL (Gate Induced Drain Leakage) is generated. A P-N junction part is located immediately below the gate electrode TG. The GIDL is generated due to the position of the P-N junction part. In reading, a leak current due to GIDL flows in the P-N junction part. Accordingly, it is impossible to turn off the transistor Tr. If the leak current is large, the current flows in the other parts than the part in which the current should flow, and this becomes noise and has an influence of increasing the sense current in sensing.

In the embodiment, in the gate electrode TG, the potential is applied independently of the select gate electrodes SGDA to SGDC on the drain side. That is, when the memory string MS is unselected in the reading operation, the third potential V3 (cutoff potential) is applied to the select gate electrodes SGDA to SGDC on the drain side, and the select gate transistor GTD is turned off. Then, the second potential V2 is applied to the gate electrode TG, and the transistor Tr is turned on. In the transistor Tr, the P-N junction part is located immediately below the gate electrode TG, however, the transistor Tr is stably turned on, and generation of GIDL may be suppressed. Thereby, it is possible to realize a stable operation.

Figure 8:
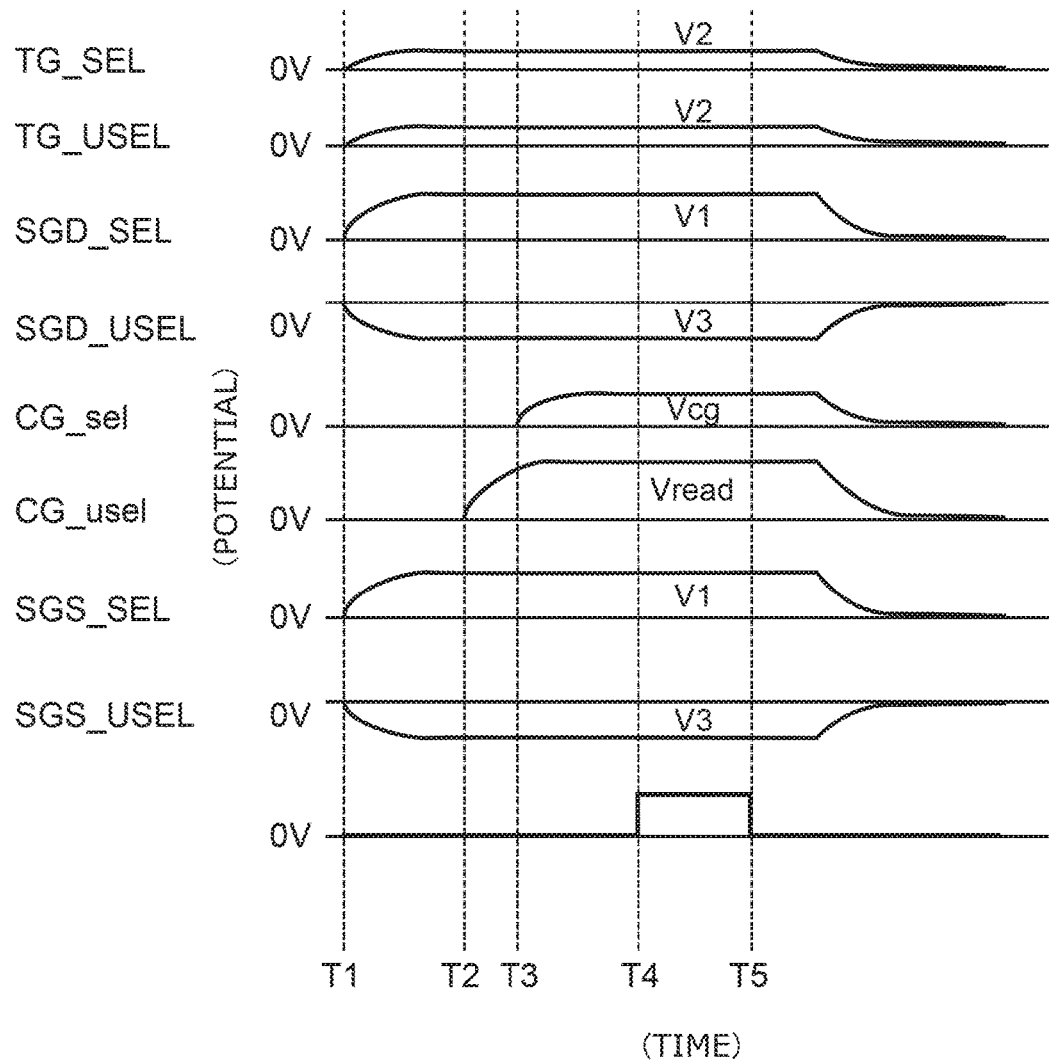
FIG. 8 is a timing chart illustrating potential characteristics in reading of the semiconductor memory device according to the embodiment.

FIG. 8 is a timing chart illustrating potential characteristics in reading of the semiconductor memory device 1 according to the embodiment.

In the drawing, the vertical axis indicates potential and the horizontal axis indicates time. TG SEL shows a potential applied to the gate electrode TG of the selected memory string. TG USEL shows a potential applied to the gate electrode TG of the unselected memory string. SGD SEL shows a potential applied to the select gate electrodes SGDA to SGDC on the drain side of the selected memory string. SGD USEL shows a potential applied to the select gate electrodes SGDA to SGDC on the drain side of the unselected memory string. CG sel shows a potential applied to the selected word line. CG usel shows a potential applied to the unselected word line. SGS SEL shows a potential applied to the select gate electrodes SGSX to SGSZ on the source side of the selected memory string. SGS USEL shows a potential applied to the select gate electrodes SGSX to SGSZ on the source side of the unselected memory string. Note that the potential applied to the select gate electrode SGSB may be the same as the potential applied to the select gate electrodes SGSX to SGSZ.

As shown in FIG. 8, at time T1, in the selected memory string, the first potential V1 is applied to the select gate electrodes SGDA to SGDC on the drain side and the select gate electrodes SGSB, SGSX to SGSZ on the source side, and the second potential V2 is applied to the gate electrode TG.

Here, the first potential V1 is a positive potential e.g. 4.3 V. The second potential V2 is a potential not more than the first potential V1 e.g. 2.4 V. The second potential V2 may be e.g. a power source potential used for the sense amplifier.

At time T1, in the unselected memory string, the third potential V3 is applied to the select gate electrodes SGDA to SGDC on the drain side and the select gate electrodes SGSB, SGSX to SGSZ on the source side. The third potential V3 is a lower potential than the first potential V1 and the second potential V2, and is a cutoff potential. The third potential V3 is e.g. −3.0 V (or may be 0 V). In the unselected memory string, the second potential V2 is applied to the gate electrode TG. A timing of applying the first potential V1 and the second potential V2 in the selected memory string is same as a timing of applying the third potential V3 and the second potential V2 in the unselected memory strings, for example.

That is, in the selected memory string, the select gate transistor GTD on the drain side, the select gate transistor GTS on the source side, and the transistor Tr are respectively turned on. In the unselected memory string, the select gate transistor GTD on the drain side and the select gate transistor GTS on the source side are turned off, and the transistor Tr is turned on.

At time T2, the unselecting potential Vread is applied to the unselected word line. The unselecting potential Vread is e.g. 7.0 V.

At time T3, the selecting potential Vcg is applied to the selected word line. The selecting potential Vcg is e.g. not less than 0 V and not more than 6 V. The selecting potential Vcg is not less than the third potential V3. The unselecting potential Vread is higher than the selecting potential Vcg. By application of the unselecting potential Vread and the selecting potential Vcg, a potential difference is generated between the bit line BL connected to the memory cell from which data is read and the source layer SL. Then, whether or not a current flows in the bit line BL is determined depending on whether the threshold value Vth of the memory cell desired to be read is larger or smaller than 0 V.

In the period from time T4 to time T5, a sense current flowing in the bit line BL or a sense voltage is detected. That is, at time T4, the sense amplifier 62 (FIG. 1) is operated.

In the above description, the case of reading is described as an example, however, even in the case of writing and erasing, similarly, the second potential V2 may be applied to the gate electrode TG and the transistor Tr may be turned on. In the transistor Tr, like the transistor of the electrode film WL, writing and erasing of data can be performed. In the case where the data of the transistor Tr is not desired to be erased, the transistor Tr may be floated.

Advantages of the embodiment are described.

According to the embodiment, the potential applied to the gate electrode TG overlapping the n⁻ diffusion layer 23 is controlled independently of the potential applied to the select gate electrodes SGDA to SGDC on the drain side. That is, in the respective selecting operation and unselecting operation of the memory string MS, the second potential V2 is applied to the gate electrode TG and the transistor Tr is turned on.

If a select gate electrode SGDD is used in place of the gate electrode TG, GIDL is generated. This will be described as below. The select gate electrode SGDD is one of the select gate electrodes like the select gate electrodes SGDA to SGDC. That is, the drain-side select gate electrode layer SGD includes four select gate electrodes.

Figure 9:
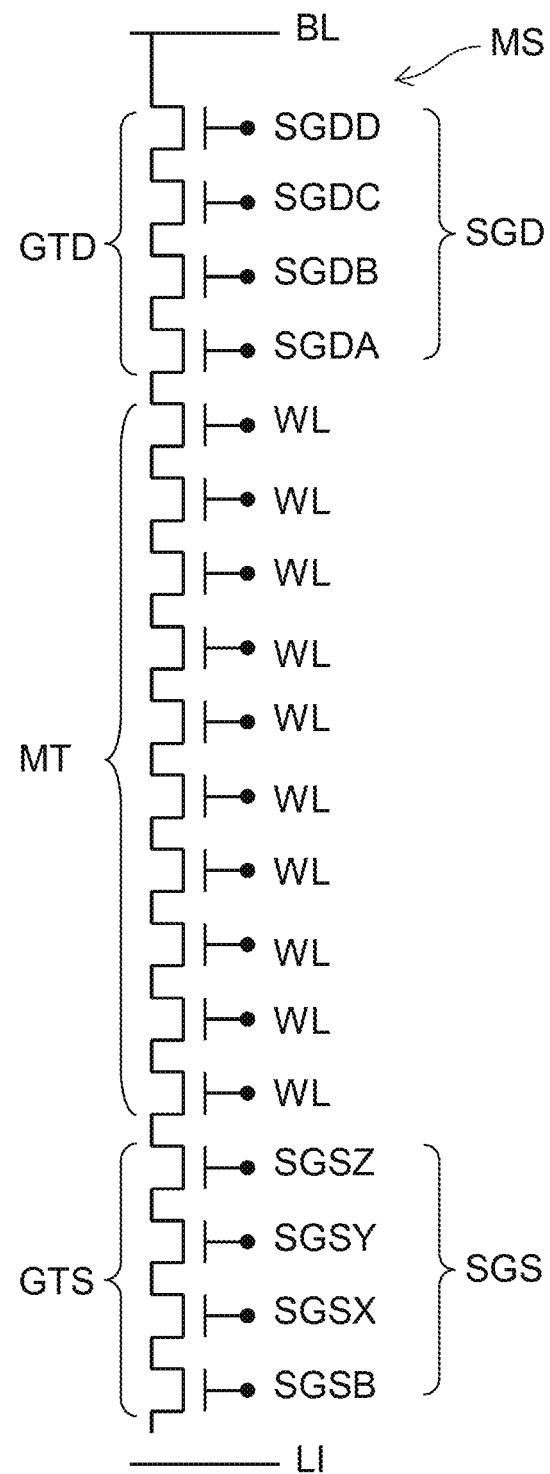
FIG. 9 is a schematic circuit diagram showing a semiconductor memory device according to a reference example.

FIG. 9 is a schematic circuit diagram showing a semiconductor memory device according to a reference example.

As shown in FIG. 9, the drain-side select gate electrode layer SGD includes four select gate electrodes SGDA to SGDD. The select gate electrode SGDD overlaps an n⁻ diffusion layer (not shown). In this case, the same potential is applied to the four select gate electrodes SGDA to SGDD. Accordingly, the same cutoff potential as that to the select gate electrodes SGDA to SGDC is also applied to the select gate electrode SGDD.

On the basis of the following graphs, a relationship between the select gate electrode SGDD in FIG. 9 and GIDL will be described.

Figure 10A:
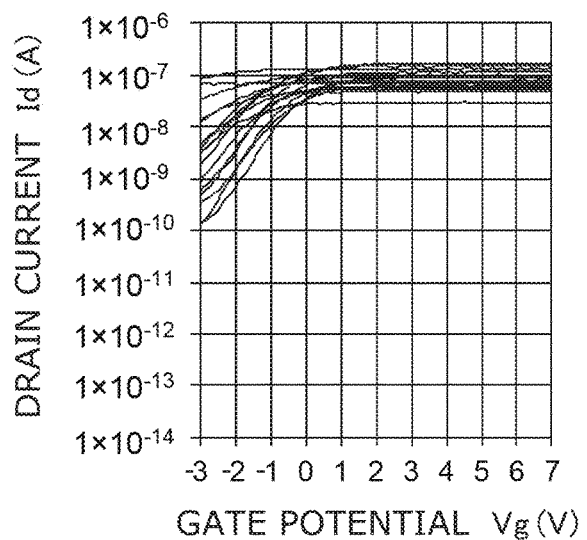
FIG. 10A to FIG. 10C are graphs showing current-potential characteristics when gate potentials are applied to the select gate electrodes.
Figure 10B:
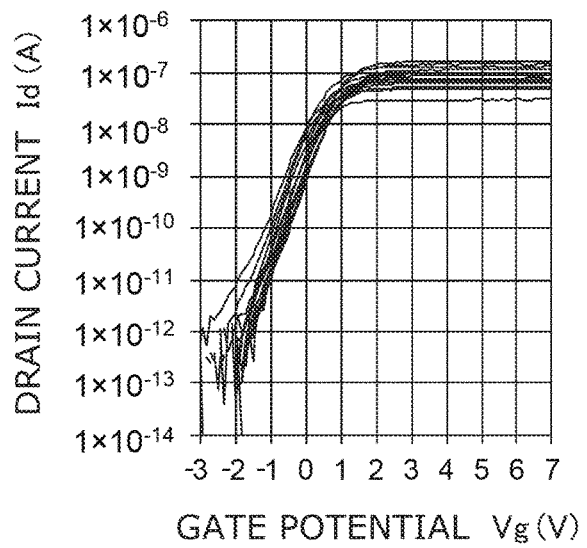
Figure 10C:
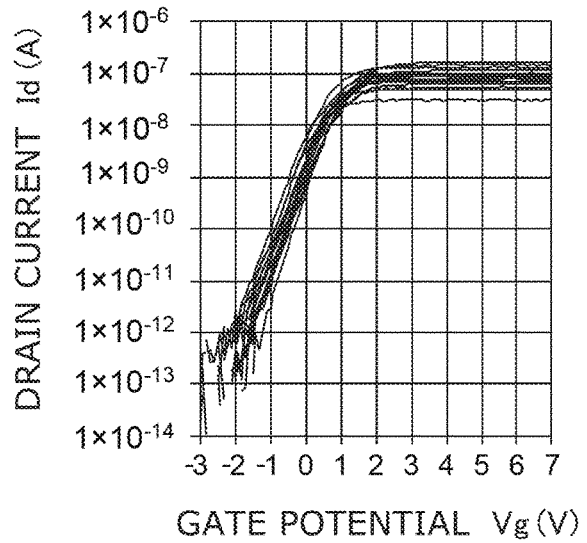

FIG. 10A to FIG. 10C are graphs showing current-potential characteristics when gate potentials are applied to the select gate electrodes.

FIG. 10A shows the current-potential characteristics when gate potentials are applied to the select gate electrode SGDD.

FIG. 10B shows the current-potential characteristics when gate potentials are applied to the select gate electrode SGDC.

FIG. 10C shows the current-potential characteristics when gate potentials are applied to the select gate electrode SGDB.

In FIG. 10A to FIG. 10C, the vertical axis indicates drain current Id (A) and the horizontal axis indicates gate potential Vg (V).

Figure 11:
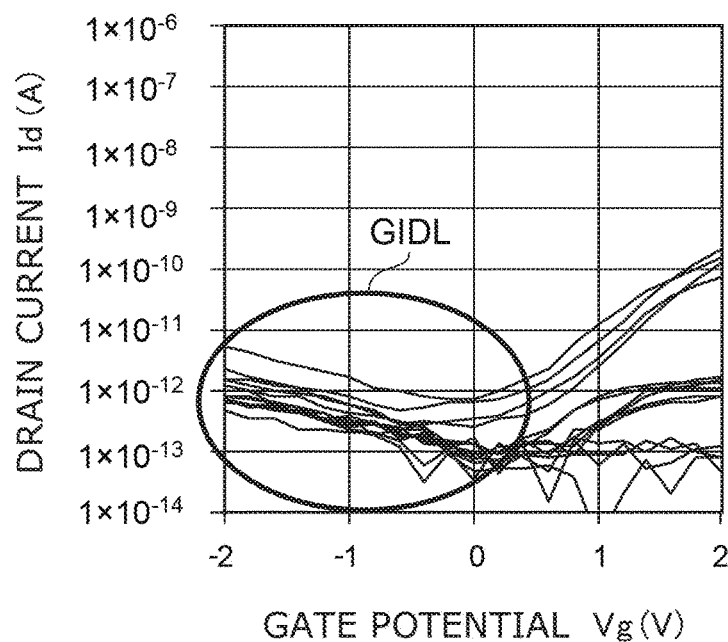
FIG. 11 is a graph showing a generation state of GIDL.

FIG. 11 is a graph showing a generation state of GIDL.

In the drawing, the vertical axis indicates drain current Id (A) and the horizontal axis indicates gate potential Vg (V).

As shown in FIG. 10A to FIG. 10C, it is impossible to cut off the select gate transistor GTD including the select gate electrode SGDD even at −3 V at which the select gate transistor GTD including the select gate electrode SGDC and the select gate transistor GTD including the select gate electrode SGDB are turned off. This is because GIDL as shown in FIG. 11 is generated in the select gate transistor GTD including the select gate electrode SGDD.

A P-N junction part is located immediately below the select gate electrode SGDD. In reading, a leak current due to GIDL flows in the P-N junction part. Accordingly, it is impossible to turn off the select gate transistor GTD including the select gate electrode SGDD. If the leak current is large, the current flows in the other parts than the part in which the current should flow, and this becomes noise and has an influence of increasing the sense current in sensing.

In the select gate transistor GTD including the select gate electrode SGDD, writing is performed, and thereby, it is possible to adjust the transistor to the threshold value at the same degree as the select gate transistor GTD including the select gate electrode SGDC and the select gate transistor GTD including the select gate electrode SGDB. However, in the multi-select gate transistor, the same potential is applied to the select gate electrodes of the respective select gate transistors for operation as one select gate transistor. A different potential is applied to each of the select gate electrodes, individual potential control is required and the peripheral circuit is increased. Accordingly, that is undesirable.

Further, when GIDL is generated in the select gate transistor on the drain side, hot carrier may be generated. The hot carrier refers to an electron or an electron hole in which high energy has been obtained in the semiconductor. The select gate transistor on the drain side basically has the same structure as the memory cell and can perform writing and erasing. Accordingly, fluctuations in characteristics of the select gate transistor due to the hot carrier may easily occur. As shown in FIG. 11, GIDL has the minimum value at a certain gate electrode. Once fluctuations in the threshold value due to the hot carrier occur, the GIDL may increase and deterioration of the characteristics of the select gate transistor may be promoted.

On the other hand, according to the embodiment, the potential applied to the gate electrode TG overlapping the n⁻diffusion layer 23 is controlled independently of the potential applied to the select gate electrodes SGDA to SGDC on the drain side. That is, in the respective selecting operation and unselecting operation of the memory string MS, the second potential V2 is applied to the gate electrode TG and the transistor Tr is turned on. Thereby, it is possible to suppress the GIDL in FIG. 11.

Figure 12:
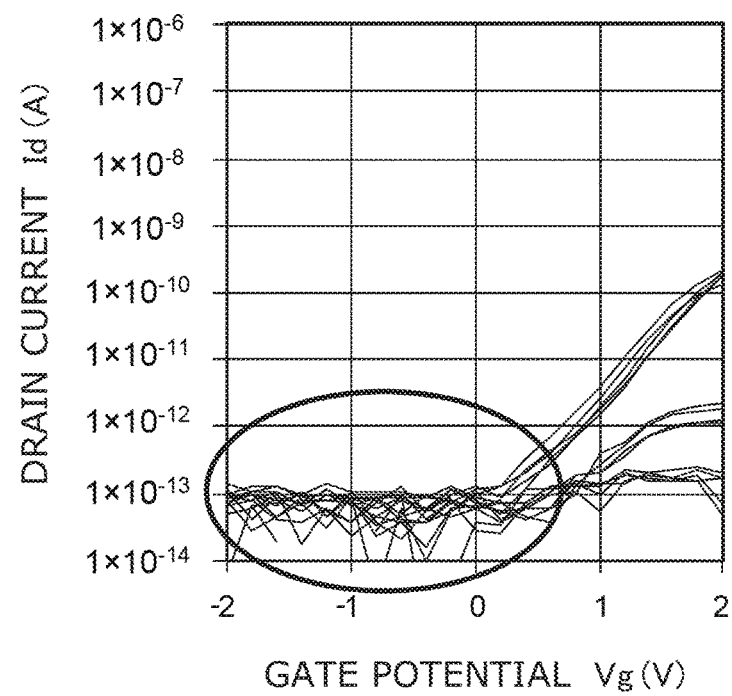
FIG. 12 is a graph illustrating current-potential characteristics when a different potential from the gate potential is applied to the gate electrode and the gate potential is applied to the select gate electrodes.

FIG. 12 is a graph illustrating current-potential characteristics when a different potential from the gate potential is applied to the gate electrode TG and the gate potential is applied to the select gate electrodes SGDA to SGDC.

In the drawing, the vertical axis indicates drain current Id (A) and the horizontal axis indicates gate potential Vg (V).

According to the graph, the GIDL components in FIG. 11 are suppressed.

That is, when the memory string MS is unselected in reading operation, the third potential V3 (cutoff potential) is applied to the select gate electrodes SGDA to SGDC on the drain side and the select gate transistor GTD is turned off. Then, the second potential V2 is applied to the gate electrode TG and the transistor Tr is turned on. In the transistor Tr, the P-N junction part is located immediately below the gate electrode TG, however, the transistor is stably turned on, and generation of GIDL may be suppressed. Thereby, it is possible to realize a stable operation.

As described above, according to the embodiment, the transistor Tr is operated independently of the select gate transistor GTD on the drain side. That is, in reading, the third potential V3 (cutoff potential) is applied to the select gate electrodes SGDA to SGDC on the drain side and the select gate transistor GTD is turned off, and the second potential V2 is applied to the gate electrode TG and the transistor Tr is turned on. Thereby, it is possible to suppress generation of GIDL. Thereby, it is possible to realize a stable operation.

Further, by suppression of the GIDL components, the off-state current may be made lower. By reduction of the off-state current, the noise level in sensing can be made lower. Thereby, it is possible to sense with the lower current. In the three-dimensional memory structure using polysilicon for the channel, it is hard to extract the cell current. The polysilicon has mobility not more than a thirtieth of that of single-crystal silicon. Accordingly, if the gate width W is made larger, the whole memory string has large resistance (not more than 1 MΩ). On this account, in the three-dimensional memory structure using polysilicon for the channel, it is harder to extract the cell current than in a two-dimensional memory structure using single-crystal silicon for the channel. Therefore, it is desirable to reduce the sense current for realization of a stable operation.

In the embodiment, the select gate transistor GTD on the drain side is operated independently of the transistor Tr. Accordingly, the number of gates of the multi-select gate transistor is smaller. However, as described above, the severe cutoff characteristics are required in reading for the select gate transistor GTD on the drain side. The select gate transistor GTD including the select gate electrode SGDD has a normally-on property by overlapping, and does not originally contribute to cutoff. Therefore, it is considered that independence given to the select gate transistor GTD that does not contribute to cutoff as the transistor Tr is not disadvantageous.

Second Embodiment

In the first embodiment, the potential applying the first gate electrode TG1 of the selected memory string is same as the potential applying the second gate electrode TG2 of the unselected memory string. In the embodiment, the potential applying the first gate electrode TG1 of the selected memory string is different from the potential applying the second gate electrode TG2 of the unselected memory string.

As shown in FIG. 4 and FIG. 6, the controller 67 applies the first potential V1 to the first select gate electrodes SGDA1 to SGDC1 and applies the second potential V2 to the first gate electrode TG1. The controller 67 applies the third potential V3 lower than the first potential V1 to the second select gate electrodes SGDA2 to SGDC2 and applies a fourth potential V4 lower than the third potential V3 to the second gate electrode TG2.

The fourth potential V4 is different from the second potential V2. For instance, the fourth potential V4 may be set to be lower than the second potential V2. For instance, the second potential V2 may be set to be the same as the first potential V1. For instance, the second potential V2 may be set to be the same as the power source potential. As described above, in the selecting operation and the unselecting operation, the same potential is not necessarily applied to the gate electrode TG.

As a specific example, the first potential V1 is a positive potential e.g. 4.3 V. The third potential V3 is a negative potential e.g. −3.0 V. The third potential V3 may be 0 V. The third potential V3 is e.g. a cutoff potential. For instance, the second potential V2 may be higher than the third potential V3 and not more than the first potential V1. For instance, the second potential V2 may be higher than the third potential V3 and not more than the power source potential. The second potential V2 is desirably not less than 1.0 V and more desirably not less than 2.0 V and not more than 5.0 V. The fourth potential V4 is desirably not less than 1.0 V and more desirably not less than 2.0 V and not more than 5.0 V. Note that the respective transistors are of the n-type like those in the first embodiment.

Figure 13:
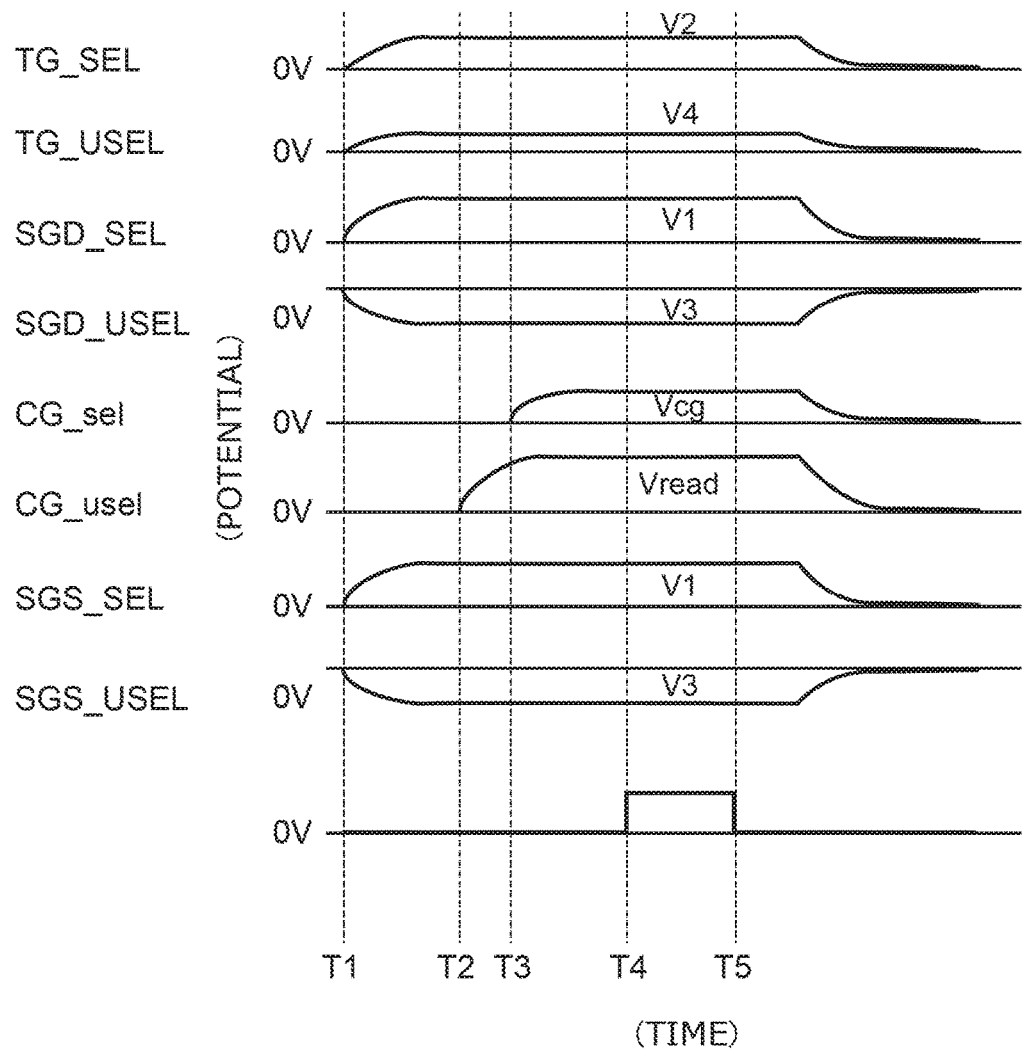
FIG. 13 is a timing chart illustrating potential characteristics in reading of a semiconductor memory device according to a second embodiment.

FIG. 13 is a timing chart illustrating potential characteristics in reading of a semiconductor memory device according to the second embodiment.

In the drawing, the vertical axis indicates potential and the horizontal axis indicates time. TG SEL shows a potential applied to the gate electrode TG of the selected memory string. TG USEL shows a potential applied to the gate electrode TG of the unselected memory string. SGD SEL shows a potential applied to the select gate electrodes SGDA to SGDC on the drain side of the selected memory string. SGD USEL shows a potential applied to the select gate electrodes SGDA to SGDC on the drain side of the unselected memory string. CG sel shows a potential applied to the selected word line. CG usel shows a potential applied to the unselected word line. SGS SEL shows a potential applied to the select gate electrodes SGSX to SGSZ on the source side of the selected memory string. SGS USEL shows a potential applied to the select gate electrodes SGSX to SGSZ on the source side of the unselected memory string. Note that the potential applied to the select gate electrode SGSB may be the same as the potential applied to the select gate electrodes SGSX to SGSZ.

As shown in FIG. 13, at time T1, in the selected memory string, the first potential V1 is applied to the select gate electrodes SGDA to SGDC on the drain side and the select gate electrodes SGSB, SGSX to SGSZ on the source side, and the second potential V2 is applied to the gate electrode TG.

Here, the first potential V1 is e.g. 4.3 V. The second potential V2 is a potential not more than the first potential V1 e.g. 2.4 V. The second potential V2 may be e.g. a power source potential used for the sense amplifier.

At time T1, in the unselected memory string, the third potential V3 is applied to the select gate electrodes SGDA to SGDC on the drain side and the select gate electrodes SGSB, SGSX to SGSZ on the source side. The third potential V3 is a lower potential than the first potential V1 and the second potential V2, and is a cutoff potential. In the unselected memory string, the fourth potential V4 different from the second potential V2 is applied to the gate electrode TG. A timing of applying the first potential V1 and the second potential V2 in the selected memory string is same as a timing of applying the third potential V3 and the fourth potential V4 in the unselected memory strings, for example.

That is, in the selected memory string, the select gate transistor GTD on the drain side, the select gate transistor GTS on the source side, and the transistor Tr are respectively turned on. In the unselected memory string, the select gate transistor GTD on the drain side and the select gate transistor GTS on the source side are turned off, and the transistor Tr is turned on.

At time T2, the unselecting potential Vread is applied to the unselected word line. The unselecting potential Vread is e.g. 7.0 V.

At time T3, the selecting potential Vcg is applied to the selected word line. The selecting potential Vcg is e.g. not less than 0 V and not more than 6 V. The selecting potential Vcg is not less than the third potential V3. The unselecting potential Vread is higher than the selecting potential Vcg. By application of the selecting potential Vread and the unselecting potential Vcg, a potential difference is generated between the bit line BL connected to the memory cell from which data is read and the source layer SL. Then, whether or not a current flows in the bit line BL is determined depending on whether the threshold value Vth of the memory cell desired to be read is larger or smaller than 0 V.

In the period from time T4 to time T5, a sense current flowing in the bit line BL or a sense voltage is detected. That is, at time T4, the sense amplifier 62 (FIG. 1) is operated.

In the embodiment, the fourth potential V4 is different from the second potential V2. For instance, the fourth potential V4 may be set to be lower than the second potential V2. For instance, the second potential V2 may be set to be the same as the first potential V1. For instance, the second potential V2 may be set to be the same as the power source potential. As described above, in the selecting operation and the unselecting operation, the same potential is not necessarily applied to the gate electrode TG.

Third Embodiment

Figure 14:
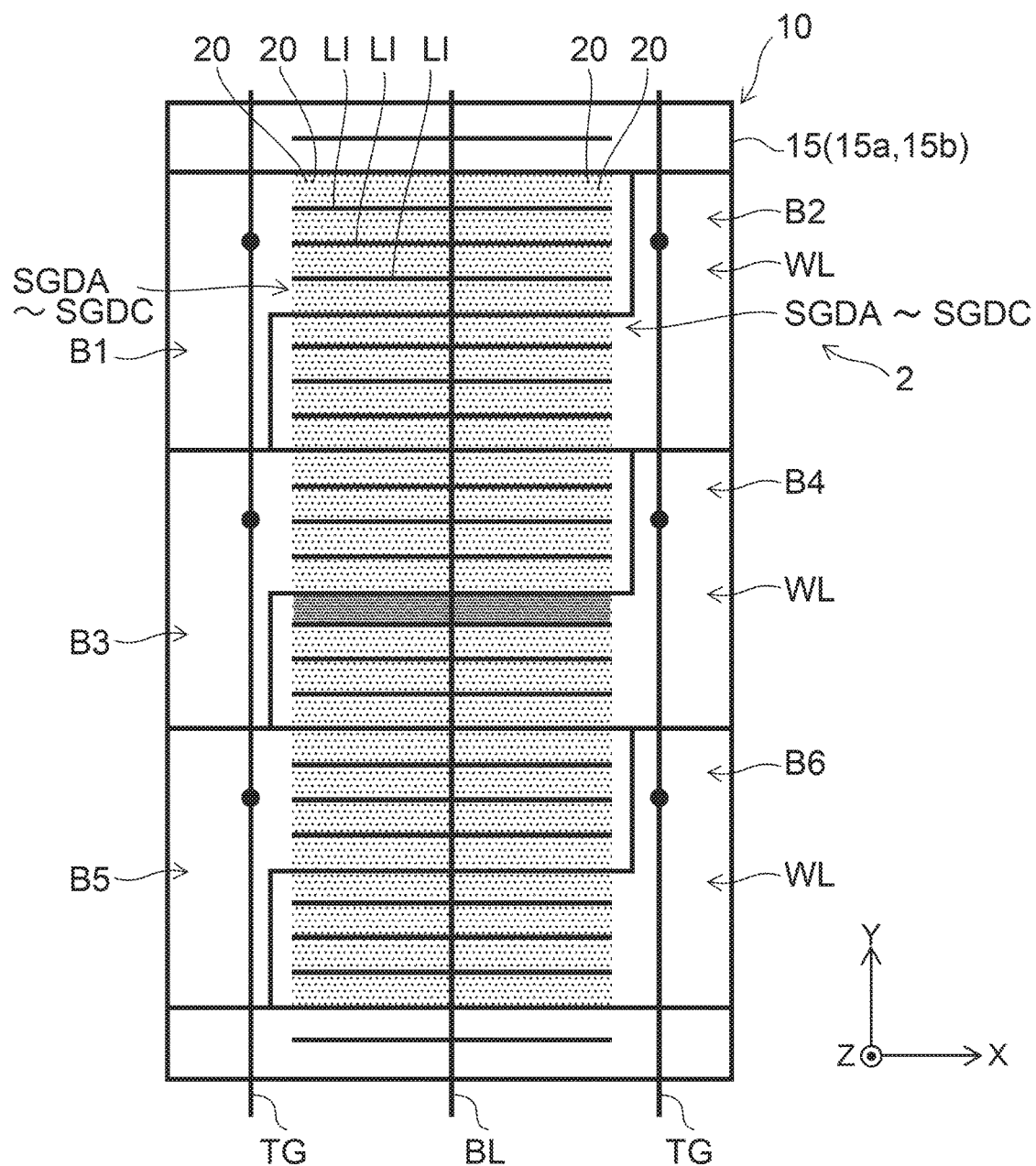
FIG. 14 is a schematic plan view illustrating a semiconductor memory device according to a third embodiment.

FIG. 14 is a schematic plan view illustrating a semiconductor memory device according to the third embodiment.

FIG. 14 schematically shows interconnects in the upper part of the memory cell array in FIG. 2 as viewed from above.

A semiconductor memory device 2 according to the embodiment includes a memory cell array 10. The memory cell array 10 includes a stacked body 15. The stacked body 15 includes a first block B1 and a second block B2. The second block B2 is arranged with the first block B1 in the X-direction. In each of the first block B1 and the second block B2, a plurality of semiconductor pillars 20, a gate electrode TG, and select gate electrodes SGDA to SGDC are provided.

The controller 67 applies the second potential V2 to the respective gate electrodes TG of the first block B1 and the second block B2 in the reading operation of the memory cell MC. For instance, the gate electrodes TG are short-circuited between the first block B1 and the second block B2.

The same applies to three or more blocks. In the example, the stacked body 15 includes six blocks. In the stacked body 15, two in the X-direction and three in the Y-direction, a total of six blocks are arranged. That is, the stacked body 15 further includes third to sixth blocks B3 to B6 in addition to the first and second blocks B1, B2. Like the first and second blocks B1, B2, in each of the third to sixth blocks B3 to B6, a plurality of semiconductor pillars 20, the gate electrodes TG, and select gate electrodes SGDA to SGDC are provided.

The controller 67 applies the second potential V2 to the respective gate electrodes TG of the first to sixth blocks B1 to B6 in the reading operation of the memory cell MC. For instance, the gate electrodes TG are short-circuited among the first to sixth blocks B1 to B6.

That is, regardless of whether the memory string MS is selected or unselected in the reading operation, the same second potential V2 is applied to the gate electrodes TG in the plurality of blocks and the transistor Tr is turned on. The number of blocks is not particularly limited.

As described above, the semiconductor memory device 2 has an interconnect structure that short-circuits the gate electrodes TG in the plurality of blocks. By the structure, it is possible to suppress generation of GIDL and stably operate even in the semiconductor memory device 2 including the plurality of blocks.

Fourth Embodiment

Figure 15:
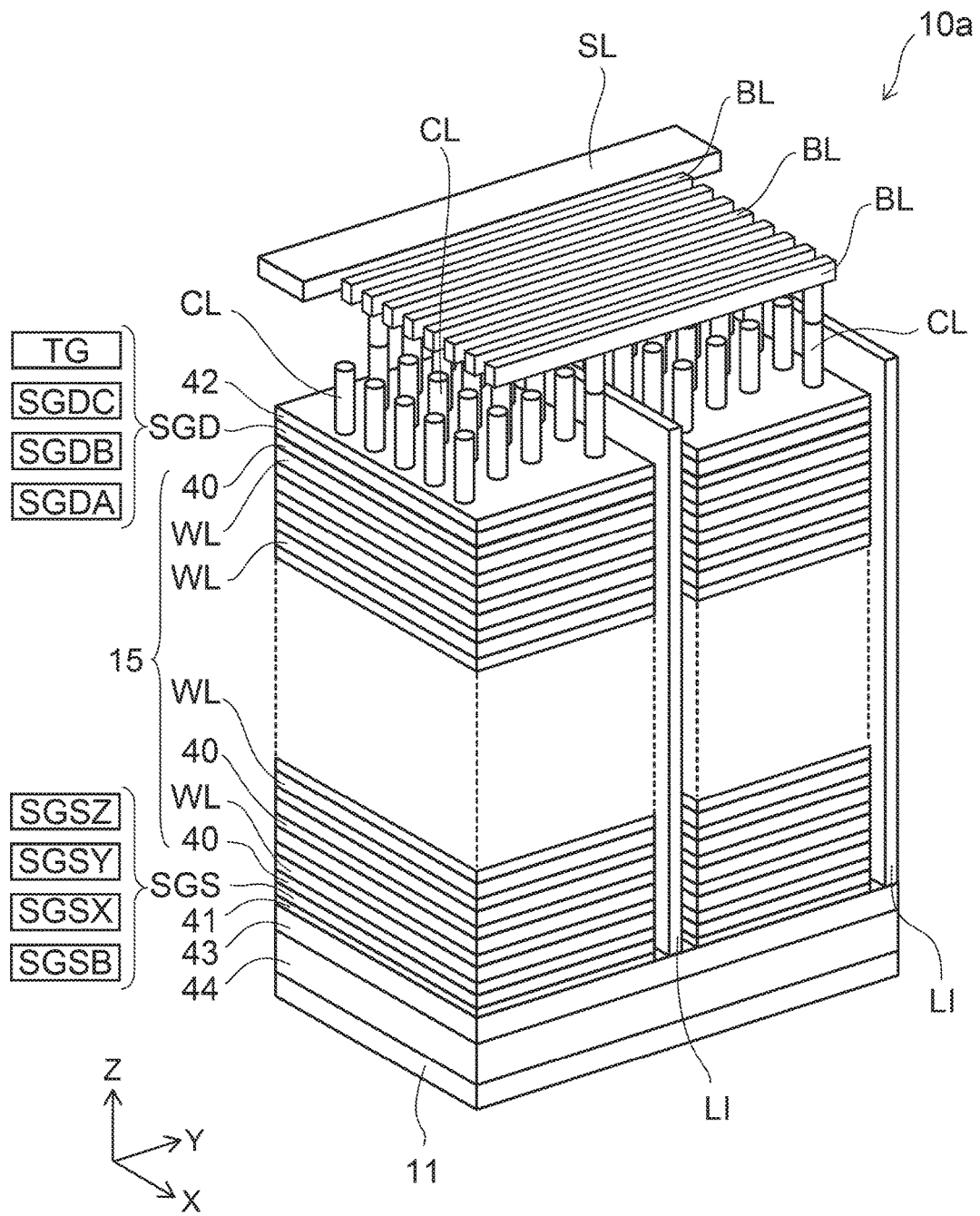
FIG. 15 is a schematic perspective view illustrating a memory cell array according to a fourth embodiment.

The memory cell array according to the first embodiment may have a structure shown in FIG. 15 in place of the structure shown in FIG. 2.

FIG. 15 is a schematic perspective view illustrating a memory cell array according to the fourth embodiment.

A memory cell array 10a further has e.g. a conductive film 43 and an insulating film 44 compared to the memory cell array 10.

The insulating film 44 is provided on the substrate 11. Within the insulating film 44, interconnect layers and circuit elements of transistors or the like (not shown) are provided. The conductive film 43 is provided on the insulating film 44. The insulating film 41 is provided on the conductive film 43. The configuration upper than the insulating film 41 is the same as e.g. that of the memory cell array 10.

The lower ends of the inter-layer interconnect layers LI are electrically connected to the semiconductor pillars 20 within the memory columnar bodies CL via the conductive film 43.

Fifth Embodiment

Figure 16:
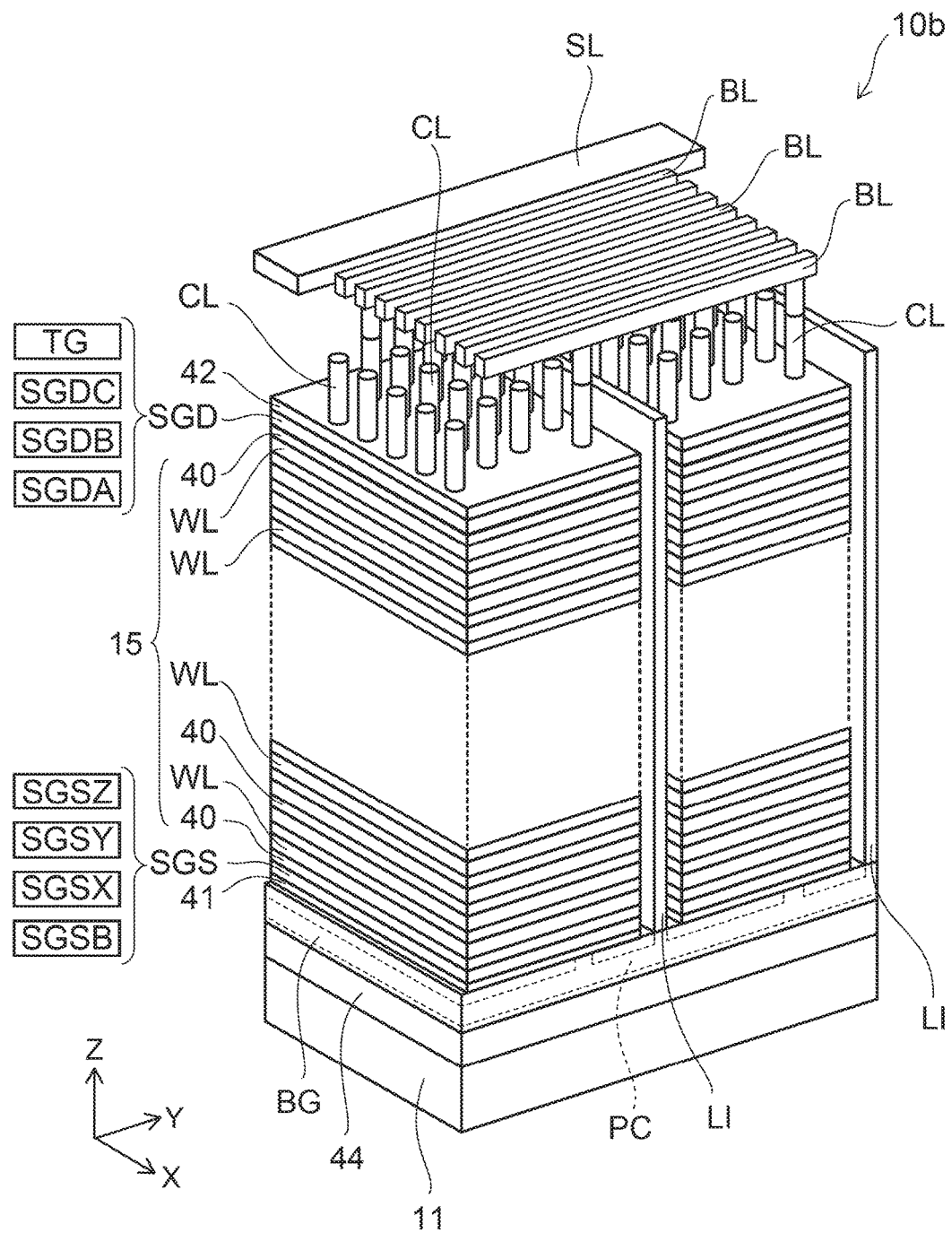
FIG. 16 is a schematic perspective view illustrating a memory cell array according to a fifth embodiment.

FIG. 16 is a schematic perspective view illustrating a memory cell array according to the fifth embodiment.

As shown in FIG. 16, a memory cell array 10b includes a substrate 11, a back gate BG (conductive layer), a stacked body 15, a plurality of memory columnar bodies CL, inter-layer interconnect layers LI, and upper layer interconnects. The upper layer interconnects include bit lines BL and a source layer SL.

The back gate BG is provided on the substrate 11 via the insulating film 44. A source-side select gate electrode layer SGS is provided on the back gate BG via the insulating film 41. The stacked body 15 is provided on the source-side select gate electrode layer SGS. The stacked body 15 includes a plurality of electrode films WL and a plurality of insulating films 40.

A drain-side select gate electrode layer SGD is provided on the stacked body 15. The insulating film 42 is provided on the drain-side select gate electrode layer SGD.

The memory columnar body CL includes e.g. a semiconductor pillar 20 and a memory film 30 like the first embodiment. The plurality of memory columnar bodies CL are arranged along the X-direction and the Y-direction.

The inter-layer interconnect layers LI extend in the X-direction and the Y-direction between the adjacent stacked bodies 15. The lower surfaces of the inter-layer interconnect layers LI are electrically connected to the memory columnar bodies CL via a connecting portion PC provided within the back gate BG. The upper ends of the inter-layer interconnect layers LI are connected to the source layer SL provided on the stacked body 15.

The connecting portion PC is integrally provided with the memory columnar bodies CL and extends in the X-direction and the Y-direction within the back gate BG. In the connecting portion PC, e.g. the plurality of memory columnar bodies CL are integrally provided. Note that "integrally provided" refers to extension of a part of the material used for the memory columnar bodies CL to the connecting portion PC. Therefore, a memory film and a semiconductor pillar are provided in a part of the connecting portion PC like the memory columnar body CL.

The plurality of bit lines BL are provided on the stacked body 15. The plurality of bit lines BL are respectively separated in the X-direction and extend in the Y-direction. The upper ends of the semiconductor pillars 20 are connected to the bit lines BL via the contact portions.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
    a substrate;
    a plurality of first control gate electrodes stacked along a first direction above the substrate;
    a plurality of second control gate electrodes stacked along the first direction above the substrate, the plurality of second control gate electrodes being arranged with the plurality of first control gate electrodes in a second direction intersecting the first direction;
    a first select gate electrode provided above the plurality of first control gate electrodes;
    a second select gate electrode provided above the plurality of second control gate electrodes;
    a first gate electrode provided above the first select gate electrode;
    a second gate electrode provided above the second select gate electrode;
    a bit line provided above the first gate electrode and the second gate electrode, the bit line extending in the second direction;
    a first semiconductor pillar piercing the plurality of first control gate electrodes, the first select gate electrode and the first gate electrode in the first direction and electrically connected to the bit line;
    a second semiconductor pillar piercing the plurality of second control gate electrodes, the second select gate electrode and the second gate electrode in the first direction and electrically connected to the bit line; and
    a controller configured to apply a first potential to the first select gate electrode, a third potential lower than the first potential to the second select gate electrode, a second potential to the first and second gate electrodes, a selecting potential not less than the third potential to one of the plurality of first control gate electrodes, and an unselecting potential higher than the selecting potential to other than the one of the plurality of first control gate electrodes in a reading operation.

2. The device according to claim 1, wherein the first semiconductor pillar includes a first portion of a first conductive type and a second portion of a second conductive type, the second portion being provided between the first portion and the bit line, and having higher carrier concentration than carrier concentration of the first portion, at least a part of the second portion overlapping at least a part of the first gate electrode when projected on a flat surface along the first direction.

3. The device according to claim 2, wherein the first select gate electrode does not overlap the second portion when projected on the flat surface.

4. The device according to claim 2, wherein a boundary between the first portion and the second portion is located above the first select gate electrode in the first direction.

5. The device according to claim 2, wherein the first conductive type is of a p-type and the second conductive type is of an n-type.

6. The device according to claim 5, wherein the second portion includes a first $n^+$ diffusion layer and a first $n^-$ diffusion layer having lower carrier concentration than carrier concentration of the first $n^+$ diffusion layer, and
    at least a part of the first $n^-$ diffusion layer overlaps at least a part of the first gate electrode when projected on the flat surface.

7. The device according to claim 1, wherein the second potential is higher than the third potential and not more than the first potential.

8. The device according to claim 1, wherein the first potential is a positive potential to a potential of the first semiconductor pillar and the third potential is a negative potential to the potential of the first semiconductor pillar.

9. The device according to claim 1, wherein the first gate electrode and the second gate electrode are short-circuited.

10. A semiconductor memory device comprising:
    a substrate;
    a plurality of first control gate electrodes stacked along a first direction above the substrate;
    a plurality of second control gate electrodes stacked along the first direction above the substrate, the plurality of second control gate electrodes being arranged with the plurality of first control gate electrodes in a second direction intersecting the first direction;
    a first select gate electrode provided above the plurality of first control gate electrodes;
    a second select gate electrode provided above the plurality of second control gate electrodes;
    a first gate electrode provided above the first select gate electrode;
    a second gate electrode provided above the second select gate electrode;
    a bit line provided above the first gate electrode and the second gate electrode, the bit line extending in the second direction;
    a first semiconductor pillar piercing the plurality of first control gate electrodes, the first select gate electrode and the first gate electrode in the first direction and electrically connected to the bit line;
    a second semiconductor pillar piercing the plurality of second control gate electrodes, the second select gate electrode and the second gate electrode in the first direction and electrically connected to the bit line; and a controller configured to apply a first potential to the first select gate electrode, a third potential lower than the first potential to the second select gate electrode, a second potential to the first gate electrode, a fourth potential higher than the third potential to the second gate electrode, a selecting potential not less than the third potential to one of the plurality of first control gate electrodes, and an unselecting potential higher than the selecting potential to other than the one of the plurality of first control gate electrodes in a reading operation.

11. The device according to claim 10, wherein the first semiconductor pillar includes a first portion of a first conductive type and a second portion of a second conductive type, the second portion being provided between the first portion and the bit line, and having higher carrier concentration than carrier concentration of the first portion, at least a part of the second portion overlapping at least a part of the first gate electrode when projected on a flat surface along the first direction.

12. The device according to claim 11, wherein the first select gate electrode does not overlap the second portion when projected on the flat surface.

13. The device according to claim 11, wherein a boundary between the first portion and the second portion is located above the first select gate electrode in the first direction.

14. The device according to claim 11, wherein the first conductive type is of a p-type and the second conductive type is of an n-type.

15. The device according to claim 14, wherein the second portion includes a first $n^+$ diffusion layer and a first $n^-$ diffusion layer having lower carrier concentration than carrier concentration of the first $n^+$ diffusion layer, and
    at least a part of the first $n^-$ diffusion layer overlaps at least a part of the first gate electrode when projected on the flat surface.

16. The device according to claim 10, wherein the second potential is higher than the third potential and not more than the first potential.

17. The device according to claim 10, wherein the first potential is a positive potential to a potential of the first semiconductor pillar and the third potential is a negative potential to the potential of the first semiconductor pillar.

* * * * *